(12) United States Patent
Yamazaki et al.

(10) Patent No.: US 8,622,198 B2
(45) Date of Patent: Jan. 7, 2014

(54) COMPONENT TRANSFERRING APPARATUS AND IC HANDLER

(75) Inventors: Takashi Yamazaki, Suwa (JP); Hiroaki Fujimori, Suwa (JP); Naohisa Maeda, Okaya (JP); Daisuke Kirihara, Chino (JP); Satoshi Nakamura, Matsumoto (JP); Masami Maeda, Suwa (JP)

(73) Assignee: Seiko Epson Corporation (JP)

( * ) Notice: Subject to any disclaimer, the term of this patent is extended or adjusted under 35 U.S.C. 154(b) by 2 days.

(21) Appl. No.: 13/275,619

(22) Filed: Oct. 18, 2011

(65) Prior Publication Data

US 2012/0034052 A1 Feb. 9, 2012

Related U.S. Application Data

(63) Continuation of application No. 12/127,236, filed on May 27, 2008, now abandoned.

(30) Foreign Application Priority Data

Jun. 22, 2007 (JP) .................................. 2007-165406

(51) Int. Cl.
*B65G 47/34* (2006.01)

(52) U.S. Cl.
USPC ....................................................... 198/468.2

(58) Field of Classification Search
USPC ........... 414/222.02, 744.7, 749.1, 749.3, 754, 414/752.1, 751.1, 589; 198/346.2, 468.2, 198/346.1, 341.05, 339.1, 341.01
See application file for complete search history.

(56) References Cited

U.S. PATENT DOCUMENTS 5,140,643 A 8/1992 Izumi et al.
5,631,573 A 5/1997 Ohno
5,864,944 A * 2/1999 Kashiwagi et al. ............. 29/833
6,152,679 A 11/2000 Araya et al.
6,538,425 B1 3/2003 Kawada
6,791,346 B2 * 9/2004 Mehta et al. ............. 324/750.13
6,836,959 B2 1/2005 Watanabe et al.
6,984,973 B2 * 1/2006 Fujimori et al. ......... 324/757.04
2005/0235489 A1 10/2005 Okuda et al.

FOREIGN PATENT DOCUMENTS

| JP | 06-249915 | 9/1994 |
|---|---|---|
| JP | 08-304510 | 11/1996 |
| JP | 10-332763 | 12/1998 |
| JP | 3063899 | 5/2000 |
| JP | 2003-023430 | 3/2003 |

* cited by examiner

*Primary Examiner* — Saul Rodriguez
*Assistant Examiner* — Glenn Myers
(74) *Attorney, Agent, or Firm* — Harness, Dickey & Pierce, P.L.C.

(57) ABSTRACT

An apparatus includes: a retainer moving between a shuttle and a socket; a presser holding a component; an adjuster moving the presser; a socket mark near the socket; a hand mark near the socket mark when the retainer is at a component mounting position; a first camera photographing a first image including the component and hand mark; a second camera photographing a second image including the socket mark and socket, and a third image including the socket mark and hand mark; a first calculator obtaining a first relative position between the socket mark and socket from the second image; a second calculator obtaining a second relative position between the socket mark and hand mark from the third image; and a third calculator obtaining a third relative position between the hand mark and component from the first image. The adjuster corrects the component's position based on the relative positions.

21 Claims, 16 Drawing Sheets

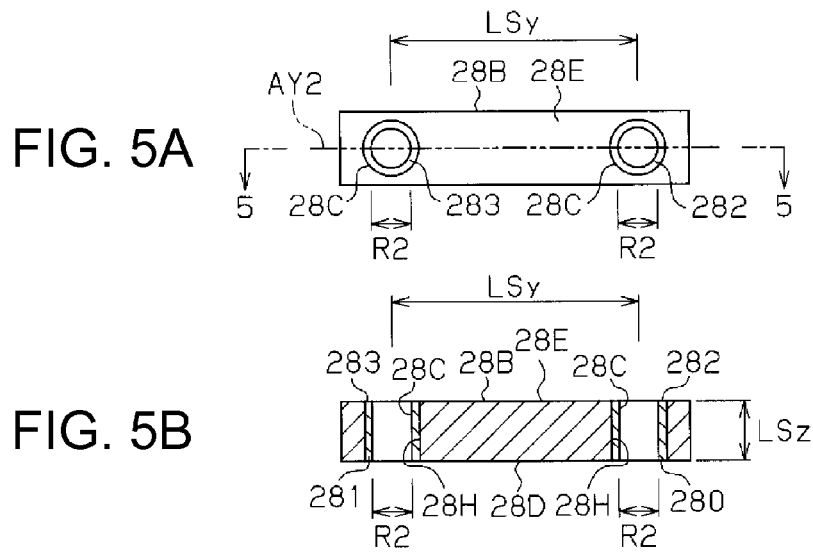
FIG. 5A
FIG. 5B
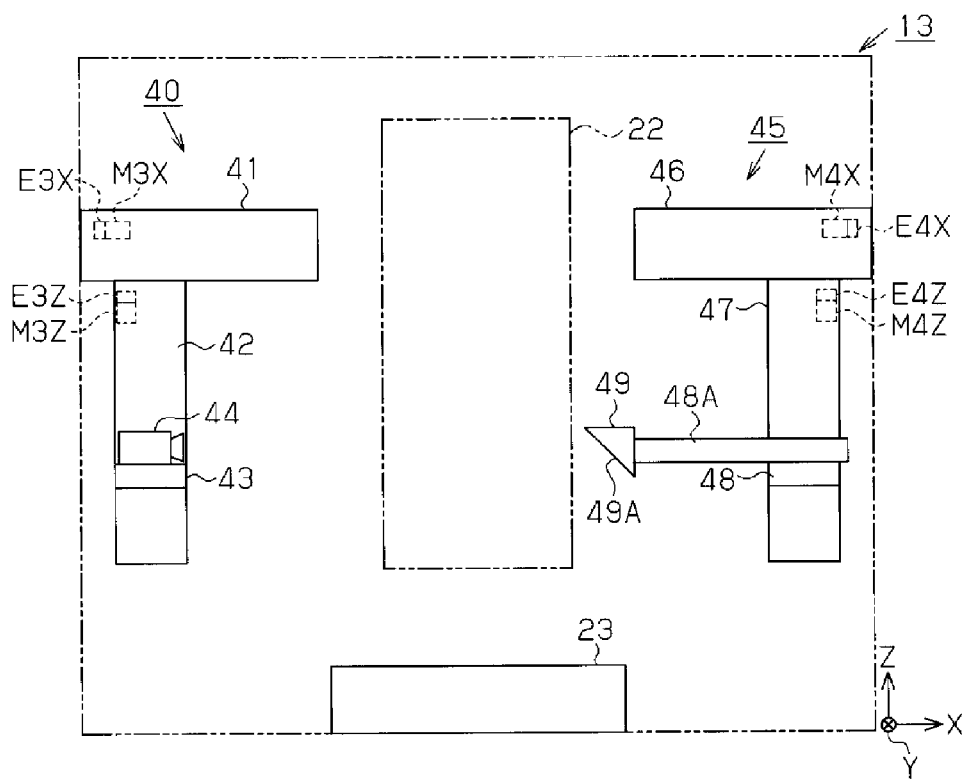
FIG. 6

COMPONENT TRANSFERRING APPARATUS AND IC HANDLER

CROSS REFERENCE TO RELATED APPLICATIONS

This application is a continuation of U.S. patent application Ser. No. 12/127,236 filed on May 27, 2008 which claims priority to Japanese Patent Application No. 2007-165406 filed on Jun. 22, 2007, which is hereby expressly incorporated by reference herein in its entirety.

BACKGROUND

1. Technical Field

The present invention relates to a component transferring apparatus and an IC handler.

2. Related Art

In general, a testing apparatus (an IC handler) that inspects electronic components such as semiconductor chips includes a plurality of transferring robots to transfer the components. The transferring robots transfer an electronic component before inspection into an inspection socket to measure quality of the component, and then, retrieve the inspected component from the socket.

Specifically, for example, a supplying robot sucks and holds an electronic component before inspection and then releases the component to mount in a supply pocket of a shuttle. Next, the shuttle moves the electronic component to a position where a measuring robot is located to suck and hold the component. The measuring robot transfers the electronic component before inspection from the shuttle to the inspection socket. After inspection is finished, the measuring robot again sucks and holds the component inspected to transfer it from the inspection socket into a retrieval pocket of the shuttle. Then, the shuttle moves the inspected component to a position of a retrieving robot, where the retrieving robot releases the component into a retrieval tray in accordance with an inspection result.

When the robots sequentially transfer the electronic component to the inspection socket and the pockets, the component is needed to be mounted in a predetermined position in each of the inspection socket and the pockets. Particularly, in order to mount the electronic component in the inspection socket, it is necessary to suitably contact measuring terminals of the inspection socket with terminals of the electronic component. Thus, it is desirable to minimize a relative positional deviation between the electronic component and the inspection socket. Additionally, when the component is mounted in each pocket, reducing a relative positional deviation between the pocket and the component is desired.

In order to reduce the relative positional deviation between the electronic component and the inspection socket or the like, there is known a method. In this method, first, a camera photographs the electronic component, the inspection socket or the like to obtain image data. Next, an image processing of the data is performed to calculate the relative deviation amount, and then, based on a calculation result, positional correction is performed by only the relative deviation amount.

For example, there is disclosed a method for correcting a relative positional deviation between an electronic component and a socket or the like (e.g. WO 2003/023430). In an IC handler employed in the method, when an electronic component before inspection is transferred from a shuttle to a test device, a camera located between the shuttle and a test socket (the test device) photographs the component sucked and hold by a transfer head of a transferring apparatus. Additionally, a camera equipped with the transfer head photographs the test device. A controlling device of the IC handler performs the image processing of each image data obtained by the above photographing operations to calculate a relative deviation between the electronic component and the test device. Then, based on a calculation result, the controlling device operates an adjustment mechanism of the transferring apparatus to adjust a position of the transfer head so as to correct the relative deviation between the component and the test device.

Additionally, when transferring the inspected electronic component from the shuttle to a tray, a pick and place (P&P) robot sucks and holds the component to transfer from the shuttle to the tray. The IC handler moves the P&P robot to above a camera located within a movable range of the robot to allow the camera to photograph the component sucked by the robot. The controlling device of the IC handler performs the image processing of image data obtained from the photographing operation to calculate a relative deviation between the component and the tray. Then, based on a calculation result, the controlling device operates an adjustment mechanism of the robot to correct the relative deviation between the electronic component and the tray.

In the above method, however, in order to calculate a relative deviation between the transfer head and the test socket, the camera of the transfer head is needed to be located with a high precision. Furthermore, when a relative positional relationship between the transfer head and the camera is changed due to thermal expansion and contraction, vibration, or the like, it is impossible to detect the change to reflect a detection result in the calculation of the relative deviation.

Thus, there is disclosed a method for directly photographing an electronic component and a test device (e.g. Patent No. JP 3063899). The method provides an IC handler including a camera mounted on a supporting member with a mirror. The mirror is located between the electronic component and the test device to reflect both of the component and the test device thereon. When the component before inspection is hold by a transferring apparatus and located above the test device in a manner facing the test device, the camera simultaneously photographs both images of them reflected on the mirror.

However, in the above method, it is complicated to locate and adjust the mirror such that both the component and the test device can be reflected on the mirror. It is also difficult to locate and adjust the camera in order to photograph their mirror images. Moreover, when the electronic component and the test device are photographed, the mirror is located therebetween. Accordingly, locating and withdrawing the mirror is a time-consuming task.

SUMMARY

The present invention has been accomplished to solve the above problems. An advantage of the invention is to provide a component transferring apparatus that suitably mounts an electronic component in a socket in such a manner that changes such as mechanical distortion and thermal expansion and contraction can be reflected as needed. Another advantage of the invention is to provide an IC handler including the component transferring apparatus.

A component transferring apparatus according to a first aspect of the invention includes a shuttle, an inspection socket, a retaining device that moves between the shuttle and the inspection socket, a pressing device that is included in the retaining device to hold and transfer an electronic component, a position adjusting device that moves the pressing device to correct a position of the electronic component based on an image processing of image data obtained by photographing of the electronic component, a socket mark provided near the inspection socket, a hand mark provided on the retaining device such that the hand mark is positioned near the socket mark when the retaining device is moved to a mounting position where the electronic component hold by the pressing device is mounted in the inspection socket, a first camera provided on the shuttle to photograph a single image including the electronic component hold by the pressing device and the hand mark provided on the retaining device, a second camera that photograph a single image including the socket mark and the inspection socket and a single image including the socket mark and the hand mark of the retaining device moved to the mounting position, a first relative-position calculating unit that performs an image processing of data obtained by photographing of the single image including the socket mark and the inspection socket to obtain a first relative position between the socket mark and the inspection socket, a second relative-position calculating unit that performs an image processing of data obtained by photographing of the single image including the socket mark and the hand mark located at the mounting position to obtain a second relative position between the socket mark and the hand mark, and a third relative-position calculating unit that performs an image processing of data obtained by photographing of the single image including the electronic component and the hand mark to obtain a third relative position between the hand mark and the electronic component, wherein based on the first, the second, and the third relative positions, the position adjusting device corrects the position of the electronic component to mount the electronic component in the inspection socket.

In the component transferring apparatus of the above aspect, the socket mark is provided near the inspection socket. Thus, the inspection socket and the socket mark are photographed as the single image by the second camera, and the image processing of the image data obtained by the photographing operation is performed by the first relative-position calculating unit. In this manner, the first relative position between the inspection socket and the socket mark can be obtained. Additionally, the hand mark of the retaining device is located near the socket mark when the retaining device is located at the mounting position. Thus, the hand mark and the socket mark are photographed as the single image by the second camera, and then, the image processing of the image data obtained is performed by the second relative-position calculating unit. In this manner, the second relative position between the hand mark of the retaining device and the socket mark, namely, a relative position of the socket mark with respect to the retaining device can be obtained. Furthermore, the electronic component and the hand mark are photographed as the single image by the first camera, and then, the image processing of the data of the image is performed by the third relative-position calculating unit. In this manner, the third relative position between the electronic component and the hand mark, namely, the relative position of the electronic component with respect to the retaining device can be obtained. As a result, based on the first to the third relative positions, the position adjusting device can move the electronic component to a position suitable for the inspection socket.

Specifically, installation-induced distortion and thermal expansion and contraction occurring between the inspection socket and the socket mark are reflected in the first relative position. Additionally, the distortion and the temperature-induced change as above occurring between the socket mark and the hand mark (the retaining device) are reflected in the second relative position. Furthermore, a sucking position deviation of the electronic component with respect to the hand mark (the retaining device) is reflected in the third relative position. As a result, the electronic component can be suitably mounted in the inspection socket in such a manner that the installation-induced distortion and thermal expansion and contraction in the component transferring apparatus are reflected as needed.

Additionally, since the above-mentioned physical changes occurring in the component transferring apparatus can be reflected as needed, no calibration as an initial setting is again needed to correct those changes as above. This can reduce time and work required for the calibration.

Preferably, the component transferring apparatus includes a first mirror that is provided on the retaining device so as to reflect the socket mark and the hand mark located at the mounting position in a direction of the second camera and a second mirror that reflects the socket mark and the inspection socket in the direction of the second camera at a reflecting position above the inspection socket, in which the second camera is located at a position where the single image including the socket mark and the inspection socket cannot be directly photographed and also located at a position where the single image including the socket mark and the hand mark located at the mounting position cannot be directly photographed, as well as the second camera photographs the single image including the socket mark and the hand mark via the first mirror located at the mounting position and also photographs the single image including the socket mark and the inspection socket via the second mirror located at the reflecting position.

In the above apparatus, even when the second camera is located at the position where it is impossible for the camera to directly photograph the image including the socket mark and the inspection socket and the image including the socket mark and the hand mark, the second camera can photograph those images as in the case of direct photographing. Accordingly, the second camera can be located with greater freedom on a periphery of the retaining device and the inspection socket where the location position for the second camera is very limited. This can facilitate photographing of the socket mark and the inspection socket together and photographing of the socket mark and the hand mark together.

Additionally, the first and the second mirrors are provided, whereby the single second camera can be used to photograph both the single image including the socket mark and the inspection socket and the single image including the socket mark and the hand mark. This can help to simplify the structure of the component transferring apparatus.

In the component transferring apparatus of the first aspect, preferably, the shuttle includes the first camera, and the retaining device and the shuttle move to a first photographing position where the first camera photographs the single image including the electronic component and the hand mark, so as to allow the first camera to photograph the single image including the electronic component and the hand mark at the first photographing position.

In the above component transferring apparatus, the first camera is provided in the shuttle. Thus, it is unnecessary to provide a place for the first camera on the periphery of the retaining device and the inspection socket in which there are many limitations in the camera's location. Accordingly, the structure of the component transferring apparatus can be simplified and also the location of the first camera can be facilitated.

In the component transferring apparatus of the first aspect, preferably, the socket mark has a circular shape and the hand mark has an annular shape larger than the socket mark, so as locate the socket mark in the annular hand mark at the mounting position.

In the above apparatus, since the circular socket mark is located in the annular hand mark, a comparison between a center position of the socket mark and a center position of the hand mark can be easily made in the image processing for calculating the relative position therebetween.

In the component transferring apparatus of the first aspect, preferably, the socket mark includes at least two socket marks, and the hand mark is provided so as to correspond to each of the socket marks.

In the above apparatus, for example, using two socket marks and two hand marks enables detection of an inclination of a line connecting the two hand marks with respect to a line connecting the two socket marks. Thus, the inclination between the two lines, namely, an angular deviation between the lines can be calculated. Additionally, based on an inclination between the line connecting the socket marks and a first side of the socket, an angular deviation between the line connecting the socket marks and the first side of the socket can be calculated. Furthermore, based on an inclination between the line connecting the hand marks and a first side of the electronic component, an angular deviation between the line connecting the hand marks and the first side of the electronic component can be calculated. As a result, there can be obtained an angle of inclination of the first side of the electronic component and an angle of inclination of the first side of the inspection socket, whereby there can be calculated an angular deviation amount between the first side of the electronic component and the first side of the inspection socket. Consequently, the electronic component can be suitably mounted in the inspection socket by allowing the angular deviation amount therebetween to be "zero" so as to make the position of the electronic component coincident with the position of the inspection socket.

In the component transferring apparatus of the first aspect, preferably, the socket mark has a rectangular shape and the hand mark has a rectangular frame-like shape larger than the socket mark, so as to locate the socket mark in the frame-like hand mark at the mounting position.

In the above apparatus, even if the hand mark and the socket mark, respectively, include a single mark, center positions of the rectangular shapes of the marks can be compared with each other to calculate a relative position between the marks, as well as directions of the rectangular shapes of the marks can be compared with each other to calculate an angular deviation therebetween. Thus, it is possible to reduce the numbers of the hand mark and the socket mark.

In the component transferring apparatus of the first aspect, preferably, the first relative-position calculating unit obtains the first relative position from an average of first relative position values already obtained by a predetermined number of times of calculations, and the second relative-position calculating unit obtains the second relative position from an average of second relative position values already obtained by a predetermined number of times of calculations.

In the above apparatus, in order to obtain the first relative position between the socket mark and the inspection socket and the second relative position between the socket mark and the hand mark in which values are not abruptly fluctuated, using data obtained by the plurality of times of the calculations can stabilize values of the relative positions to be newly calculated In the component transferring apparatus of the first aspect, preferably, when the second camera photographs the single image including the socket mark and the hand mark, the retaining device allows a distance between the hand mark and the second camera to be equal to a distance between the socket mark and the second camera.

In the above apparatus, the second camera can photograph the single image including the socket mark and the hand mark that are located in a situation which the distance of the socket mark from the second camera is equal to that of the hand mark from the second camera. If the distances are different from each other, an error is likely to occur in the image processing of the image data. However, in the above apparatus, the distances of the marks from the second camera are equalized so as to reduce such an error. Accordingly, the relative distance between the socket mark and the hand mark can be more suitably calculated.

In the component transferring apparatus of the first aspect, preferably, the hand mark is shorter than the socket mark, and the retaining device moves to the mounting position before moving to a position where the distance between the hand mark and the second camera is equal to the distance between the socket mark and the second camera.

In the above apparatus, when the second camera photographs the marks, the hand mark can be separated from the mounting position. This can prevent thermal transmission to the hand mark from the inspection socket or the like and thermal expansion and contraction in the hand mark, so that the relative position between the socket mark and the hand mark can be more suitably calculated.

In the component transferring apparatus of the first aspect, preferably, the third relative-position calculating unit obtains the third relative position every time the electronic component is mounted in the inspection socket; the first relative-position calculating unit obtains the first relative position every predetermined number of times of calculations for the third relative position; and the second relative-position calculating unit obtains the second relative position every predetermined number of times of calculations for the third relative position.

The above apparatus reduces calculation frequencies of the first relative position between the socket mark and the inspection socket and the second relative position between the socket mark and the hand mark in which values are less fluctuated. This can reduce time required for the component transferring apparatus to mount the electronic component in the inspection socket.

In the component transferring apparatus of the first aspect, preferably, the third relative-position calculating unit obtains the third relative position every time the electronic component is mounted in the inspection socket; the second relative-position calculating unit obtains the second relative position every time the electronic component is mounted in the inspection socket; and the first relative-position calculating unit obtains the first relative position every predetermined number of times of calculations for the third relative position.

The above apparatus reduces the calculation frequency of the first relative position between the socket mark and the inspection socket in which the fluctuation of values is the least. This can reduce the time required for the component transferring apparatus to mount the electronic component in the inspection socket.

In the component transferring apparatus of the first aspect, preferably, the third relative-position calculating unit obtains the third relative position every time the electronic component is mounted in the inspection socket; the first relative-position calculating unit obtains the first relative position every predetermined number of times of calculations for the third relative position; and the second relative-position calculating unit obtains the second relative position when the electronic component has been transferred to the mounting position.

In the above apparatus, the second relative position between the socket mark and the hand mark is obtained when the electronic component has been mounted in the inspection socket. This can omit an additional operation for obtaining the second relative position.

An IC handler according to a second aspect of the invention includes the component transferring apparatus according to the first aspect.

In the IC hander of the second aspect, the socket mark is provided near the inspection socket. Thus, the second camera photographs the single image including the inspection socket and the socket mark, and the first relative-position calculating unit performs the image processing of data of the image. Thereby, the first relative position between the inspection socket and the socket mark can be obtained. In addition, the hand mark provided on the retaining device is located near the socket mark when the retaining device is located at the mounting position. Accordingly, the second camera photographs the single image including the hand mark and the socket mark, and then, the second relative-position calculating unit performs the image processing of data of the image. Thereby the second relative position between the hand mark of the retaining device and the socket mark, namely, the relative position of the socket mark with respect to the retaining device can be obtained. Furthermore, the first camera photographs the single image including the electronic component and the hand mark, and then, the third relative-position calculating unit performs the image processing of data of the image. Thereby, the third relative position between the electronic component and the hand mark, namely, the relative position of the electronic component with respect to the retaining device can be obtained. As a result, based on the first to the third relative positions, the position adjusting device can move the electronic component to the position suitable for the inspection socket.

Specifically, installation-induced distortion and thermal expansion and contraction occurring between the inspection socket and the socket mark are reflected in the first relative position. Additionally, the distortion and the temperature-induced physical change as above occurring between the socket mark and the hand mark (the retaining device) are reflected in the second relative position. Furthermore, the sucking position deviation of the electronic component with respect to the hand mark (the retaining device) is reflected in the third relative position. As a result, the electronic component can be suitably mounted in the inspection socket in such a manner that installation-induced distortion and thermal expansion and contraction occurring in the IC handler are reflected as needed.

Furthermore, since the above-mentioned physical changes occurring in the IC handler can be reflected as needed, it is unnecessary to perform a calibration (an initial setting) again to correct the physical changes such as the distortion and the expansion and contraction. This can reduce time and work required for the calibration.

BRIEF DESCRIPTION OF THE DRAWINGS

The invention will be described with reference to the accompanying drawings, wherein like numbers reference like elements.

FIGS. 5A and 5B, respectively, are a plan view showing a planar structure of a hand mark included in the embodiment and a sectional view of the hand mark taken along line 5-5 in FIG. 5A.

FIG. 6 is a front view showing a frontal structure of each of a photographing device and a reflecting device included in the embodiment.

DESCRIPTION OF EXEMPLARY EMBODIMENTS

Figure 1:
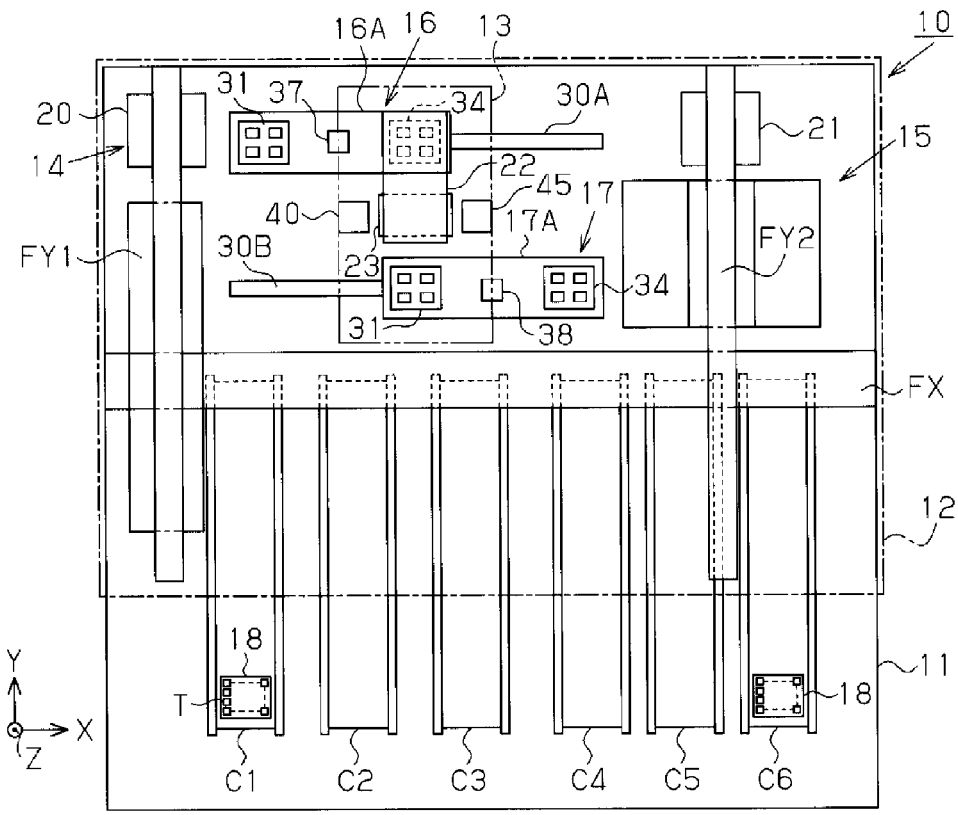
FIG. 1 is a plan view showing a planar structure of an IC handler according to an embodiment of the invention.

Hereinafter, embodiments of the invention will be described in detail with reference to the drawings.
First Embodiment FIGS. 1 to 17 will be referred to describe a first embodiment of the invention. FIG. 1 is a plan view showing an IC handler 10 including a component transferring apparatus according to the first embodiment.

The IC handler 10 includes a base 11, a safety cover 12, a high temperature chamber 13, a supplying robot 14, a retrieving robot 15, a first shuttle 16, a second shuttle 17, and a plurality of conveyors C1 to C6.

The base 11 includes the above elements provided on a top surface thereof. The safety cover 12 encloses a large area of the base 11, where there are housed the supplying robot 14, the retrieving robot 15, the first shuttle 16, and the second shuttle 17.

The conveyors C1 to C6 are provided on the base 11 such that first ends of the conveyors are located on an outside of the safety cover 12 and second ends thereof are located on an inside of the cover. Each of the conveyors C1 to C6 transfers a tray 18 that contains a plurality of IC chips T such as semiconductor chips as electronic components or threshold-setting components, from the outside to the inside of the safety cover 12 or from the inside to the outside of the cover.

The supplying robot 14 includes an X-axis frame FX, a first Y-axis frame FY1, and a supplying robot hand unit 20. The retrieving robot 15 includes the X-axis frame FX, a second Y-axis frame YF2, and a retrieving robot hand unit 21. The X-axis frame FX is arranged in an X direction. The first and the second Y-axis frames FY1 and FY2 are arranged such that both of the frames are parallel to each other in a Y direction, and also are supported movably in the X direction with respect to the X-axis frame FX. The first and the second Y-axis frames FY1 and FY2 are reciprocally moved along the X-axis frame FX in the X direction by each motor (not shown) disposed on the X-axis frame FX.

On a lower side of the first Y-axis frame FY1, the supplying robot hand unit 20 is supported movably in the Y direction. The supplying robot hand unit 20 is reciprocally moved along the first Y-axis frame FY1 in the Y direction by each motor (not shown) disposed on the first Y-axis frame FY1. For example, the supplying robot hand unit 20 supplies pretest IC chips T contained in the tray 18 of the conveyor C1 to the first shuttle 16.

On a lower side of the second Y-axis frame FY2, the retrieving robot hand unit 21 is supported movably in the Y direction. The retrieving robot hand unit 21 is reciprocally moved along the second Y-axis frame FY2 in the Y direction by each motor (not shown) disposed on the second Y-axis frame FY2. For example, the retrieving robot hand unit 21 supplies post-test IC chips T supplied to the first shuttle 16 to the tray 18 of the conveyor C6.

Between the supplying robot 14 and the retrieving robot 15 on the top surface of the base 11, a first rail 30A and a second rail 30B, respectively, are arranged in parallel to the X-axis direction. The first rail 30A includes the first shuttle 16 and the second rail 30B includes the second shuttle 17. The first and the second shuttles 16 and 17, respectively, are reciprocally movable in the X-axis direction.

The first shuttle 16 includes an approximately planar base member 16A that is elongated in the X-axis direction. On a bottom surface of the base member 16A is provided a not-shown rail guide that is in sliding contact with the first rail 30A. Then, the first shuttle 16 is reciprocally moved along the first rail 30A by a first shuttle motor M1 (See FIG. 10) included in the first shuttle 16.

On a left side on a top surface of the base member 16A (on a side where the supplying robot 14 is located), a supply change kit 31 is exchangeably fixed by a screw or the like.

On a top surface of the supply change kit 31 are formed four rectangular pockets 32 for placing the IC chips T supplied from the supplying robot 14.

Each of the pockets 32 retains each of the placed IC chips in a loosely fitting manner. Thus, the IC chip T is retained in a predetermined position of the pocket 32 when the first shuttle 16 is moved.

On a right side on the top surface of the base member 16A (on a side where the retrieving robot 15 is located), a retrieval change kit 34 similar to the supply change kit 31 is exchangeably fixed by a screw or the like to retain the IC chip T in each pocket 32 as in the supply change kit 31.

The second shuttle 17 has an approximately rectangular base member 17A that is elongated in the X-axis direction. On a bottom surface of the base member 17A is provided a not-shown rail guide in sliding contact with the second rail 30B. The second shuttle 17 is reciprocally moved along the second rail 30B by a second shuttle motor M2 (See FIG. 10) included in the second shuttle 17.

On a left side on a top surface of the base member 17A (on the side where the supplying robot 14 is located), the supply change kit 31 as in the base member 16A is exchangeably fixed by a screw or the like to retain the IC chip T in each pocket 32 of the supply change kit 31. Additionally, on a right side on the top surface of the base member 17A (on the side where the retrieving robot 15 is located), the retrieval change kit 34 similar to the supply change kit 31 is exchangeably fixed by a screw or the like to retain the IC chip T in each pocket 32.

Figure 2A:
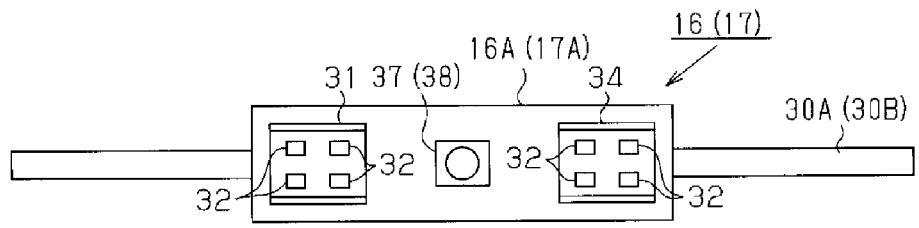
FIGS. 2A and 2B, respectively, are a plan view showing a planar structure of a shuttle included in the embodiment and a front view showing a frontal structure of the shuttle.
Figure 2B:
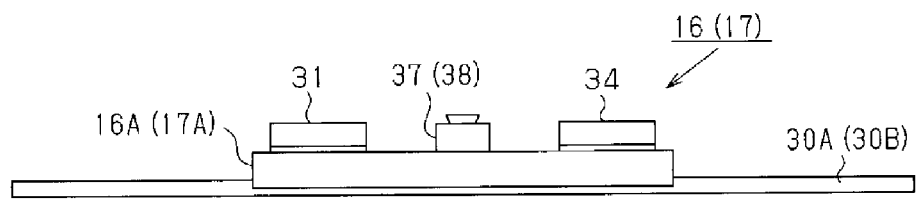

As shown in FIGS. 2A and 2B, at centers of the top surfaces of the first and the second shuttles 16 and 17, a first shuttle camera 37 and a second shuttle camera 38, each serving as a first camera, are respectively provided to photograph an object above each of the cameras. In other words, the first and the second shuttle cameras 37 and 38, respectively, are operated to photograph the IC chip T retained at an upper position by a below-mentioned measuring robot 22 from a lower position so as to output data of an image obtained by the photographing operation. At a position immediately below the measuring robot 22, an entire view of the retained IC chip T and surroundings of the chip can be photographed at one time. In addition, in the present embodiment, the first and the second shuttle cameras 37 and 38 are CCD cameras, but are not restricted to CCDs.

Figure 3A:
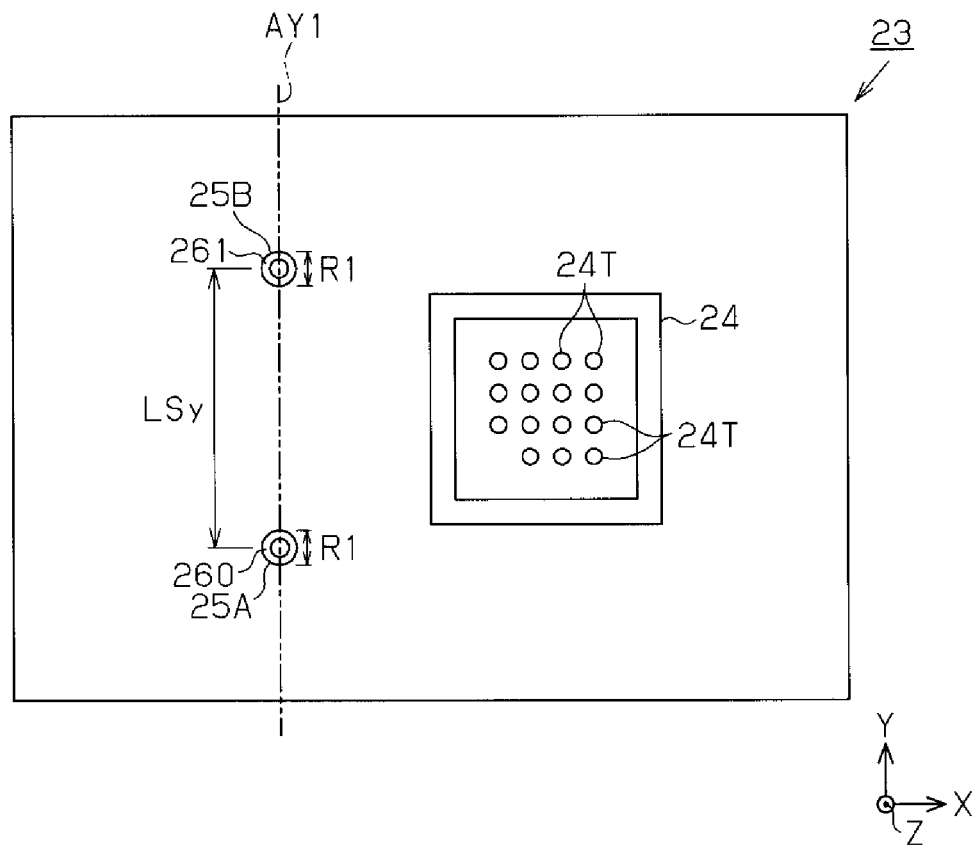
FIGS. 3A and 3B, respectively, are a plan view showing a planar structure of an inspection section included in the embodiment and a front view showing a frontal structure of the inspection section.
Figure 3B:
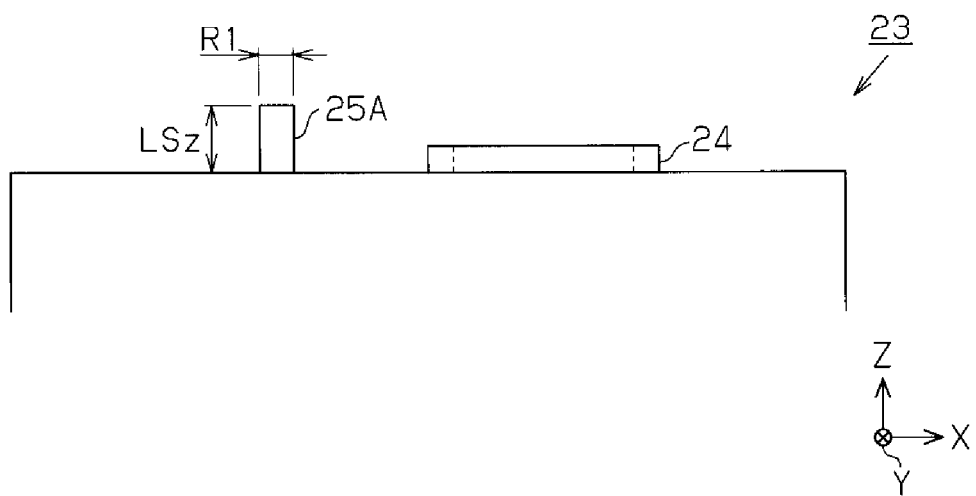

Between the first and the second shuttles 16 and 17 on the top surface of the base 11 is provided an inspection section 23. As shown in FIGS. 3A and 3B, the inspection section 23 includes an inspection socket 24 for mounting the IC chip T therein, and a first socket pin 25A and a second socket pin 25B. The first and second socket pins 25A and 25B are protrudingly provided on a socket pin arrangement line AY1 that is set closer to the supplying robot 14 than is the inspection socket 24 and that is parallel to the Y direction. The first socket pin 25A is provided on a side where the second shuttle 17 is located (a front side) and the second socket pin 25B is provided on a side where the first shuttle 16 is located (a back side). In this case, center positions of the socket pins 25A and 25B are distant from each other by a length LSy in the Y direction (front and back directions).

The inspection socket 24 is used to perform an electrical inspection of the IC chip T mounted in the socket. The inspection socket 24 includes a plurality of contact terminals 24T used for chip inspection. The contact terminals 24T correspond to connection terminals B of the IC chip T as an object to be inspected (See FIGS. 4A to 4C). In the inspection socket 24, the connection terminals B of the IC chip T are contacted with the contact terminals 24T to be electrically connected with each other so as to perform the electrical inspection of the IC chip T.

As shown in FIG. 3B, each of the socket pins 25A and 25B is formed to have a circular columnar shape with a diameter R1 and a height LSz and is made of a material that is silver and that is hardly expanded and contracted or hardly distorted even if a temperature changes, such as a metal. At circular centers of top portions of the socket pins 25A and 25B, respectively, are provided socket marks 260 and 261, respectively, used for image recognition.

The socket marks 260 and 261 are each made of a material that is circular and black, as well as is hardly expanded and contracted or hardly distorted even if a temperature changes, such as a metal. In other words, the socket pins 25A and 25B each have a color tone distinctively different from that of the socket marks 260 and 261, so that the socket marks 260 and 261 can be suitably recognized in an image recognition processing. Additionally, centers of the socket marks 260 and 261 are arranged to be positioned on the socket pin arrangement line AY1.

In the inspection section 23, the inspection socket 24 and the socket marks 260 and 261 are arranged to have a predetermined relative positional relationship.

Inside the high temperature chamber 13 is provided a not-shown rail that is arranged in the Y direction so as to stride above the first and the second shuttles 16, 17 and the inspection socket 24.

At a lower portion of the rail, the measuring robot 22 is supported in a reciprocally movable manner in the Y direction and is reciprocally moved in the Y direction by a Y-axis motor MY (See FIG. 10) provided on the rail. In other words, the measuring robot 22 is moved along the rail to mutually transfer the IC chip T between the shuttles 16, 17 and the inspection socket 24.

Specifically, the measuring robot 22 acquires the IC chip T supplied from each of the shuttles 16 and 17 to arrange the IC chip T at a position immediately above the inspection socket 24. Then, the measuring robot 22 lowers the IC chip T to allow the connection terminals B of the IC chip T to be abutted with the contact terminals 24T of the inspection socket 24 from above and pushes a spring pin downward, so as to mount the IC chip T in the inspection socket 24. After finishing an electrical inspection of the IC chip T mounted in the inspection socket 24, the measuring robot 22 extracts the IC chip T mounted therein to locate the chip at a position immediately above the retrieval change kit 34. Next, at the position immediately above the kit 34, the measuring robot 22 lowers the IC chip T to contain the chip in a predetermined one of the pockets 32 of the kit 34.

Figures 4A, 4C:
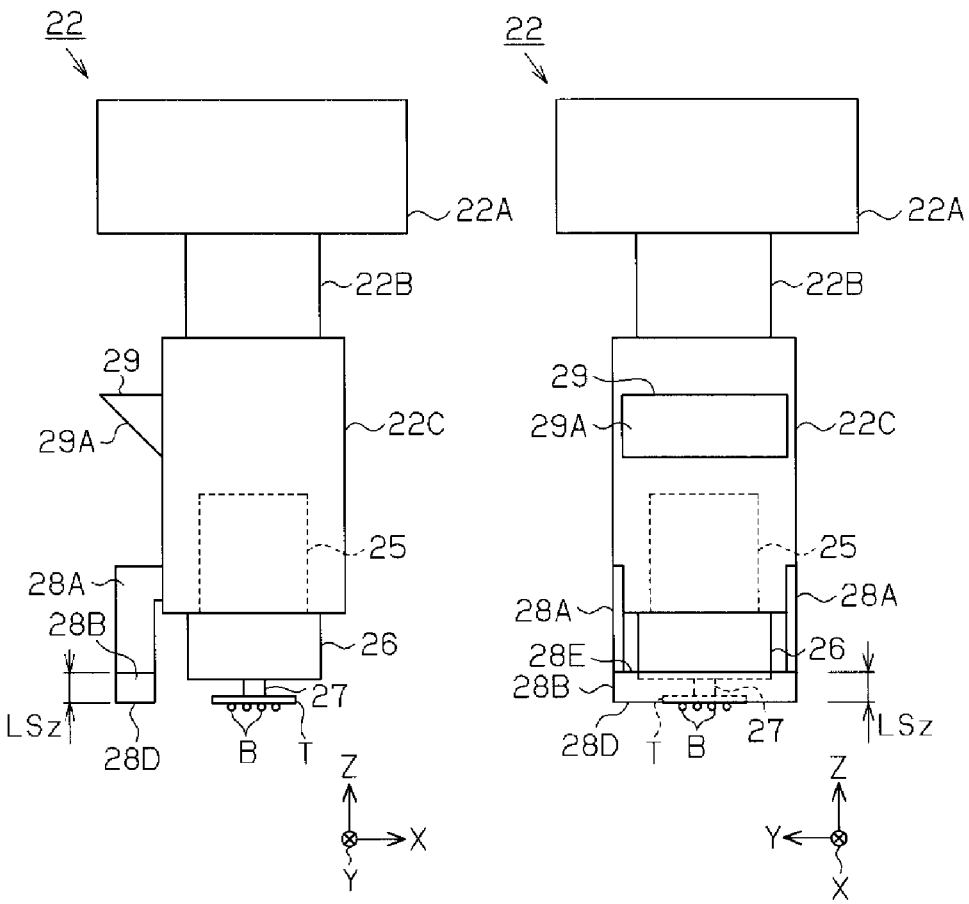
FIGS. 4A, 4B, and 4C, respectively, are a front view showing a frontal structure of a measuring robot included in the embodiment, a bottom view showing a bottom structure of the measuring robot, and a left side view showing a left side structure of the measuring robot.

As shown in FIG. 4A, the measuring robot 22 includes a supporting portion 22A, a connecting portion 22B, and a pressing and retaining portion 22C of a retaining device. An upper portion of the supporting portion 22A is supported so as to be reciprocally movable in the front and back directions (the Y direction) with respect to the not-shown rail. At a lower portion of the supporting portion 22A, the connecting portion 22B is connected and supported in a reciprocally movable manner in upper and lower directions (a Z direction) with respect to the portion 22A. The connecting portion 22B is reciprocally moved in the upper and lower directions by a Z-axis motor MZ (See FIG. 10) of the supporting portion 22A. A lower end of the connecting portion 22B is fixed to the pressing and retaining portion 22C that is reciprocally moved in the upper and lower directions along with the connecting portion 22B. In short, the pressing and retaining portion 22C of the measuring robot 22 is structured so as to be movable in the front and back directions (the Y direction) and the upper and lower directions (the Z direction) with respect to the rail.

The pressing and retaining portion 22C is located so as to be positioned immediately above the inspection socket 24 when the measuring robot 22 is moved in the front and read direction (the Y direction) to be located in a middle position between the first and the second shuttles 16 and 17.

At a lower portion of the pressing and retaining portion 22C is provided a pressing device 26 that is to be facingly opposed to the inspection socket 24 and the pockets 32. The pressing device 26 is structured to extend downward and to descend from an initial position as a descending-movement starting position to a suction starting position and a mounting position.

At a center of a lower portion of the pressing device 26 is provided a suction nozzle 27. Specifically, after the suction nozzle 27 is facingly opposed to each pocket 32 of the supply change kit 31 containing the IC chip T and the inspection socket 24, a top portion of the nozzle moves to the suction position to reach the IC chip T. Additionally, after the suction nozzle 27 is facingly opposed to each pocket 32 of the retrieval change kit 34 and the inspection socket 24, the top portion of the nozzle that sucks and holds the IC chip T is moved to the mounting position of the socket to press the IC chip T.

At the top portion of the suction nozzle 27 is provided a not-shown suction hole. The suction hole communicates through an inside of the suction nozzle 27 to be connected to a sucking device 52 via a suction valve V1 (See FIG. 10). Specifically, when the suction nozzle 27 is connected to the sucking device 52 by switching of the suction valve V1, the suction hole of the suction nozzle 27 has a negative pressure, by which the suction hole of the nozzle sucks the IC chip T. Conversely, when connection of the suction valve V1 is switched from the sucking device 52 to an atmosphere to connect the suction nozzle 27 to the atmosphere, the suction hole of the suction nozzle 27 has an atmospheric pressure, whereby the sucked IC chip T is released from the suction hole of the nozzle.

Inside the pressing and retaining portion 22C is provided a position adjusting device 25 corresponding to the pressing device 26. The position adjusting device 25 allows the pressing device 26 (the suction nozzle 27) to move in the right and left directions (the X direction) and the front and back directions (the Y direction) with respect to the pressing and retaining portion 22C, and also is structured to rotate around a center axis of the suction nozzle 27 as a rotational center with respect to a horizontal surface (an XY plane). In other words, the position adjusting device 25 moves the IC chip T sucked and hold by the suction nozzle 27 in the right and left directions (the X direction) and the front and back directions (the Y direction), as well as rotates the center axis of the suction nozzle 27 as the rotational center to correct a position of the IC chip T.

The measuring robot 22 allows the position adjusting device 25 to move the center position of the suction nozzle 27 to a predetermined initial position coincident with a predetermined center position of a bottom surface of the pressing and retaining portion 22C, as well as to rotate the center axis of the suction nozzle 27 to a predetermined initial angle where a rotational angle of the center axis of the nozzle is "zero", before sucking and holding the IC chip T by the suction nozzle 27. In other words, the suction nozzle 27 sucks and holds the IC chip T after being set to the predetermined initial position and the predetermined initial angle with respect to the pressing and retaining portion 22C.

Figure 4B:
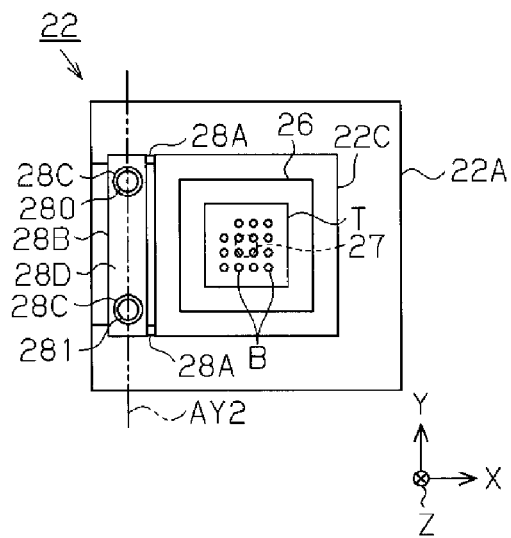

As shown in FIGS. 4A to 4C, a pair of supporting posts 28A is fixed on a side surface of the pressing and retaining portion 22C facing the supplying robot 14. The supporting posts 28A are disposed to be extended downward from the side surface by a predetermined gap between the posts in the Y direction. A mark formation member 28B is attached to lower portions of the supporting posts 28A so as to be retained by both posts.

The mark formation member 28B is, as shown in FIGS. 5A and 5B, a rectangular planar member made of a material that is silver and that is hardly expanded and contracted or hardly distorted even if a temperature changes, such as a metal. Additionally, the mark formation member 28B has the height LSz.

The mark formation member 28B has two through-holes 28H formed at a position where center positions of the holes are separated from each other by the distance LSy. Each of the through-holes 28H has a cylindrical member 28C inserted and fitted thereinside. The cylindrical members 28C each have the height LSz and an inner diameter R2 larger than the diameter R1 of each of the first and the second socket pins 25A and 25B. In other words, when the mark formation member 28B is lowered after being facingly opposed to the first and the second socket pins 25A and 25B, the first and the second socket pins 25A and 25B are inserted in the cylindrical members 28C corresponding to the socket pins, respectively. In addition, a line connecting the center positions of the through-holes 28H, namely, the center positions of the cylindrical members 28C is referred to as a hand mark arrangement line AY2. The mark formation member 28B is disposed with the pressing and retaining member 22C such that the hand mark arrangement line AY2 is approximately parallel to the Y direction.

The cylindrical members 28C are each made of a material that is black and that is hardly expanded and contracted or hardly distorted even if a temperature changes, such as a metal. Additionally, annular surfaces of the cylindrical members 28C located on a bottom surface 28D of the mark formation member 28B are referred to as a first bottom surface hand mark 280 and a second bottom surface hand mark 281 that each have an annular shape. Furthermore, annular surfaces of the cylindrical members 28C located on a top surface 28E of the mark formation member 28B are referred to as a first top surface hand mark 282 and a second top surface hand mark 283 that each have an annular shape.

The first bottom surface hand mark 280 and the first top surface hand mark 282 having the same shape are separated from each other in the Z direction. Additionally, the second bottom surface hand mark 281 and the second top surface hand mark 283 having the same shape are also provided in the same manner as above.

When the first and the second socket pins 25A and 25B, respectively, are inserted in the cylindrical members 28C, the first and the second top surface hand marks 282 and 283 are approximately as high as the first and the second socket marks 260 and 261, whereby top surface positions of those marks are made coincident with each other. Furthermore, since the mark formation member 28B has a color tone greatly different from that of the hand marks 280 to 283, the hand marks 280 to 283 can be suitably recognized in the image recognition processing.

On the side surface of the pressing and retaining portion 22C facing the supplying robot 14, a first reflector 29 is provided at a position upper than the supporting posts 28A. The first reflector 29 includes a first mirror 29A. The first reflector 29 is retained on the side surface of the pressing and retaining portion 22C facing the supplying robot 14 in such a manner that a planar mirror image of the mark formation member 28B can be reflected on the first mirror 29A. In other words, the first mirror 29A can reflect the planar mirror mage of the mark formation member 28B in a direction to the supplying robot 14 from the measuring robot 22 (in the left direction).

As shown in FIG. 6, inside the high temperature chamber 13 is provided a photographing device 40. Specifically, on a side surface inside the high temperature chamber 13 facing the supplying robot 14 is provided a horizontal rail 41 that extends in a direction of the inspection section 23 (in the right direction of FIG. 6). At a lower portion of the horizontal rail 41 is provided a vertical rail 42 that allows the horizontal rail 41 to move in the right and left directions (the X direction) by a horizontal motor M3X of the horizontal rail 41. On a side surface of a front side of the vertical rail 42 (the surface facing the second shuttle 17) is provided a supporting board 43 that allows the vertical rail 42 to move in the upper and lower directions (the Z direction) by a vertical motor M3Z of the vertical rail 42. On the supporting board 43 is provided a chamber camera 44. The chamber camera 44 serves as a second camera and is located in a direction where the camera 44 can capture a left side surface of the measuring robot 22 arranged above the inspection section 23 in a photographing range.

Specifically, the chamber camera 44 is movable to a standby position where the camera does not interfere with the measuring robot 22 and to a photographing position for photographing operation by the horizontal motor M3X and the vertical motor M3Z that are drivingly controlled. Then, the chamber camera 44 located at the photographing position can capture the first mirror 29A on the side surface of the measuring robot 22 in the photographing range to photograph the planar image of the mark formation member 28B via the first mirror 29A. In the present embodiment, the chamber camera 44 is a CCD camera but is not restricted to that.

As shown in FIG. 6, inside the high temperature chamber 13 is provided a reflector device 45. Specifically, on a side surface inside the high temperature chamber 13 facing the retrieving robot 15 is provided a horizontal rail 46 that extends in the direction of the inspection section 23 (in the left direction of FIG. 6). At a lower portion of the horizontal rail 46 is provided a vertical rail 47 that allows the horizontal rail 46 to move in the right and left directions (the X direction) by a horizontal motor M4X of the horizontal rail 46. On a side surface of a front side of the vertical rail 47 (the surface facing the second shuttle 17) is provided a supporting board 48 that allows the vertical rail 47 to move in the upper and lower directions (the Z direction) by a vertical motor M4Z of the vertical rail 47. On the supporting board 48 is provided a horizontal arm 48A extending in the direction of the inspection section 23. At a top portion of the horizontal arm 48A is provided a second reflector 49. The second reflector 49 includes a second mirror 49A that reflects a planar mirror image of the inspection section 23 in the direction of the chamber camera 44 (in the left direction of FIG. 6) when the second reflector 49 is moved and located above the inspection section 23.

When the measuring robot 22 is located above the inspection section 23, the second mirror 49A is withdrawn to a withdrawing position in a direction of the retrieving robot 15 (in the right direction of FIG. 6) so as not to interfere with the measuring robot 22. Meanwhile, when the measuring robot 22 is not present above the inspection section 23, the second mirror 49A is maintained at a position as high as the chamber camera 44 to be moved and located at a reflecting position above the inspection section 23. Then, after the second mirror 49A is located at the reflecting position, the chamber camera 44 located at the photographing position can photograph planar images of the inspection socket 24, the first and the second socket marks 260 and 261 of the inspection section 23 via the second mirror 49A.

Figure 7A:
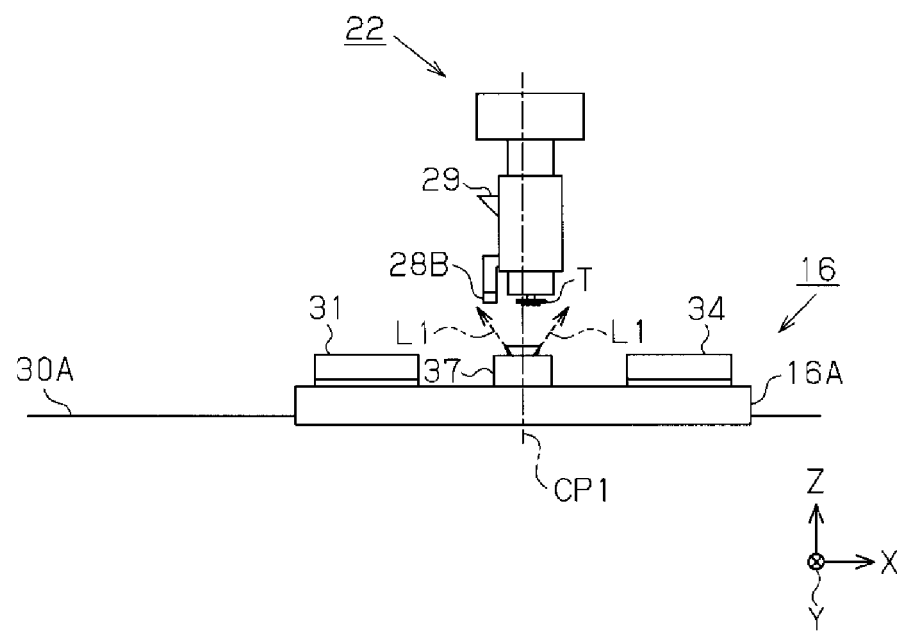
FIGS. 7A and 7B, respectively, are an illustrative view illustrating a photographing operation by a shuttle camera included in the embodiment and an illustrative view illustrating a photographing range.

In the IC handler 10, as shown in FIG. 7A, the measuring robot 22 holding the IC chip T and the first shuttle 16 can be relatively moved to a first photographing position CP1 where the first shuttle camera 37 can capture the IC chip T and the first and the second bottom surface hand marks 280 and 281 in a same visual field.

Figure 7B:
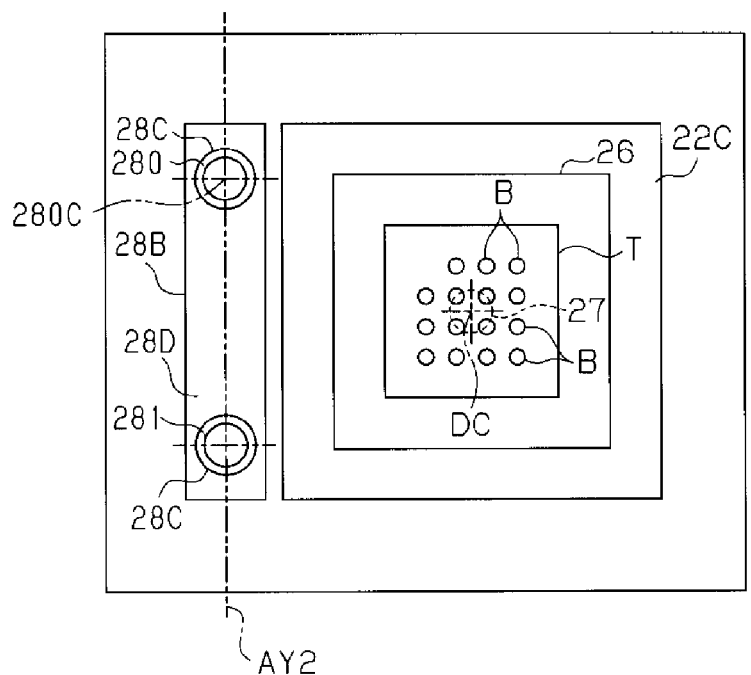

When the measuring robot 22 and the first shuttle camera 37 are relatively moved to the above position CP1, the IC chip T and the first and the second bottom surface hand marks 280 and 281 are captured in the visual field of the first shuttle camera 37, namely, a photographing range L1 so as to photograph the chip and the hand marks at one time, as shown in FIG. 7B.

Data of an image obtained in the above photographing operation is used to perform a "device recognition processing", which is an image recognition processing for obtaining coordinates of a center position DC (See FIG. 7B) of the IC chip T with respect to the first bottom surface hand mark 280 and an angular deviation of a first side of the IC chip T with respect to the hand mark arrangement line AY2.

Figure 8A:
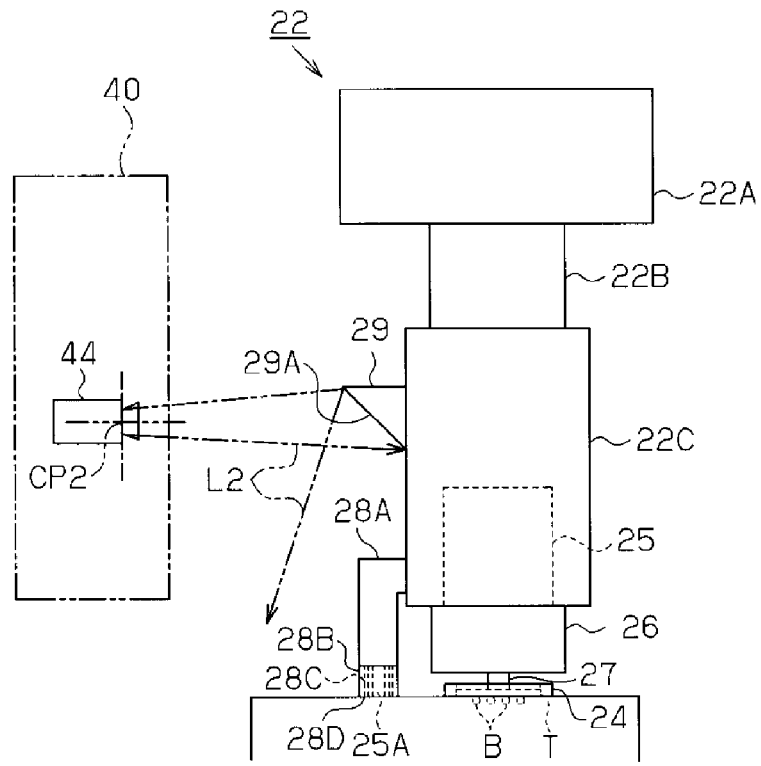
FIGS. 8A and 8B, respectively, are an illustrative view illustrating a photographing operation by a chamber camera via a first reflector included in the embodiment and an illustrative view illustrating a photographing range of the chamber camera.

As shown in FIG. 8A, the measuring robot 22 located above the inspection socket 24 mounts the retained IC chip T in the inspection socket 24. In this situation, the first and the second socket pins 25A and 25B, respectively, are inserted in the first and the second top surface hand marks 282 and 283, respectively, with a clearance fit, so as to make positions of the top surface hand marks 282 and 283 coincident with positions of the top surfaces of the socket marks 260 and 261.

Figure 8B:
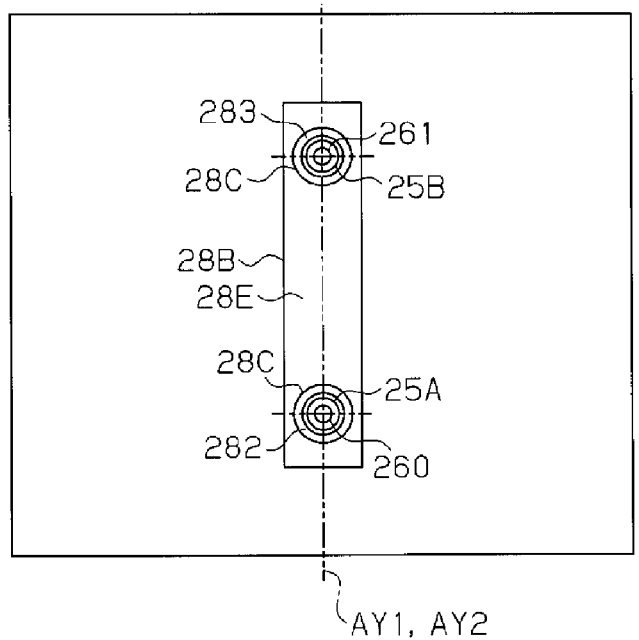

When the chamber camera 44 is located at a second photographing position CP2 where images of the top surface hand marks 282 and 283 are reflected via the first reflector 29, the chamber camera 44 captures the top surface hand marks 282 and 283 and the socket marks 260 and 261 in a photographing range L2 of the chamber camera 44, as shown in FIG. 8B, to photograph an image including those marks.

Data of the image photographed above is used to perform a "mark-position recognition processing", which is an image recognition processing for obtaining coordinates of a center position of the first top surface hand mark 282 with respect to the first socket mark 260 and an angular deviation of the hand mark arrangement line AY2 with respect to the socket pin arrangement line AY1.

Figure 9A:
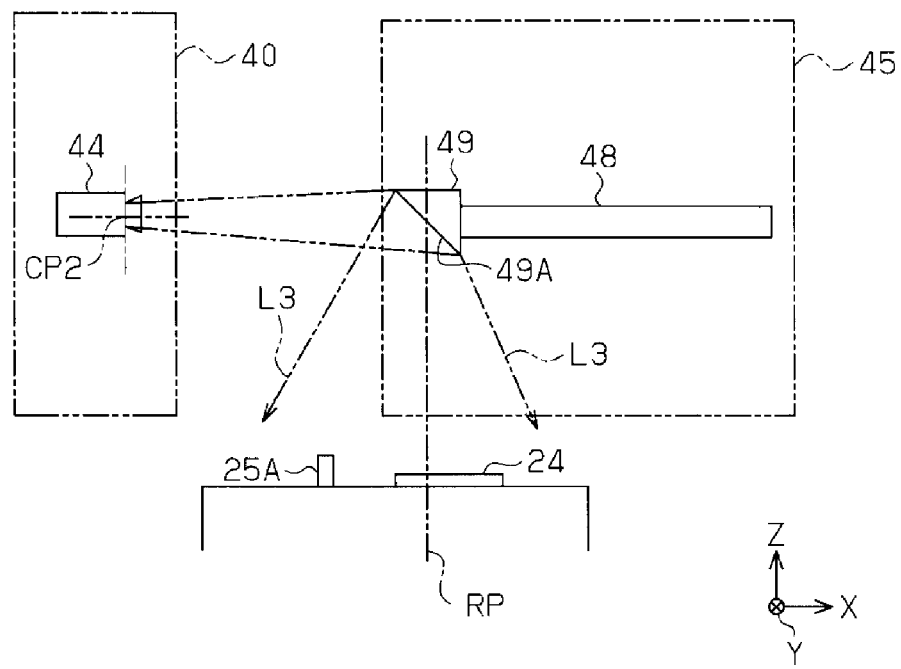
FIGS. 9A and 9B, respectively, are an illustrative view illustrating a photographing operation by a chamber camera via a second reflector included in the embodiment and an illustrative view illustrating a photographing range of the chamber camera.
Figure 9B:
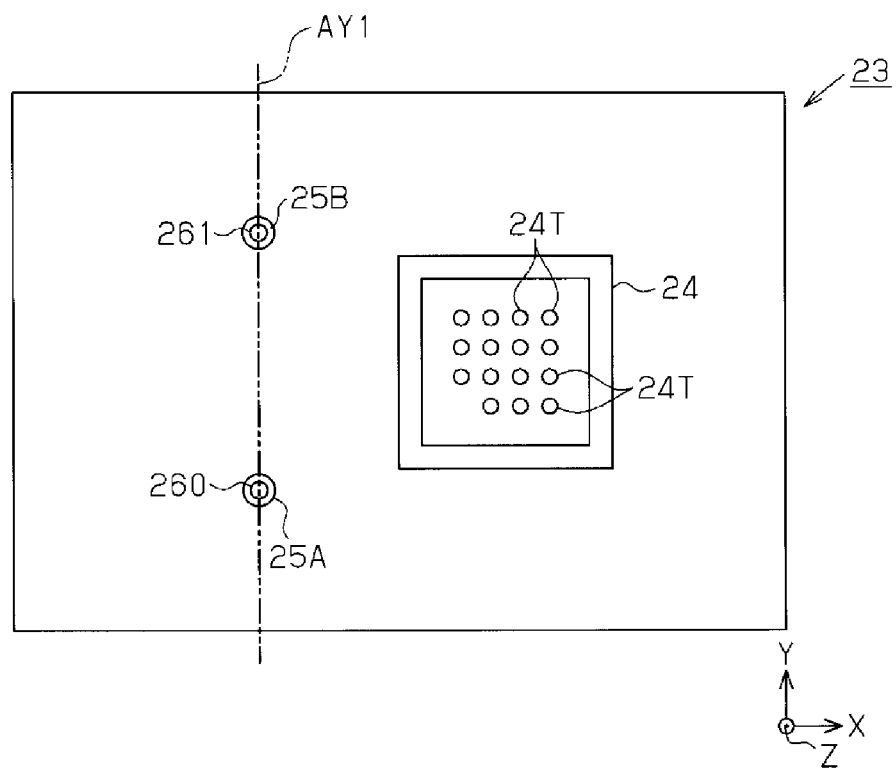

Furthermore, when the measuring robot 22 is not located above the inspection section 23, as shown in FIG. 9A, the chamber camera 44 is positioned as high as the second mirror 49A. Then, the second mirror 49A is moved to a reflecting position RP where the chamber camera 44 captures the inspection socket 24 and the socket marks 260 and 261 in a same photographing range L3. Next, as shown in FIG. 9B, the chamber camera 44 photographs the inspection socket 24 and the socket marks 260 and 261 at one time via the second mirror 49A located at the reflecting position RP.

Data of an image photographed above is used to perform a "socket recognition processing", which is an image recognition processing for obtaining coordinates of a center position SC of the inspection socket 24 with respect to the first socket mark 260 and an angular deviation of a first side of the inspection socket 24 with respect to the socket pin arrangement line AY1.

Figure 10:
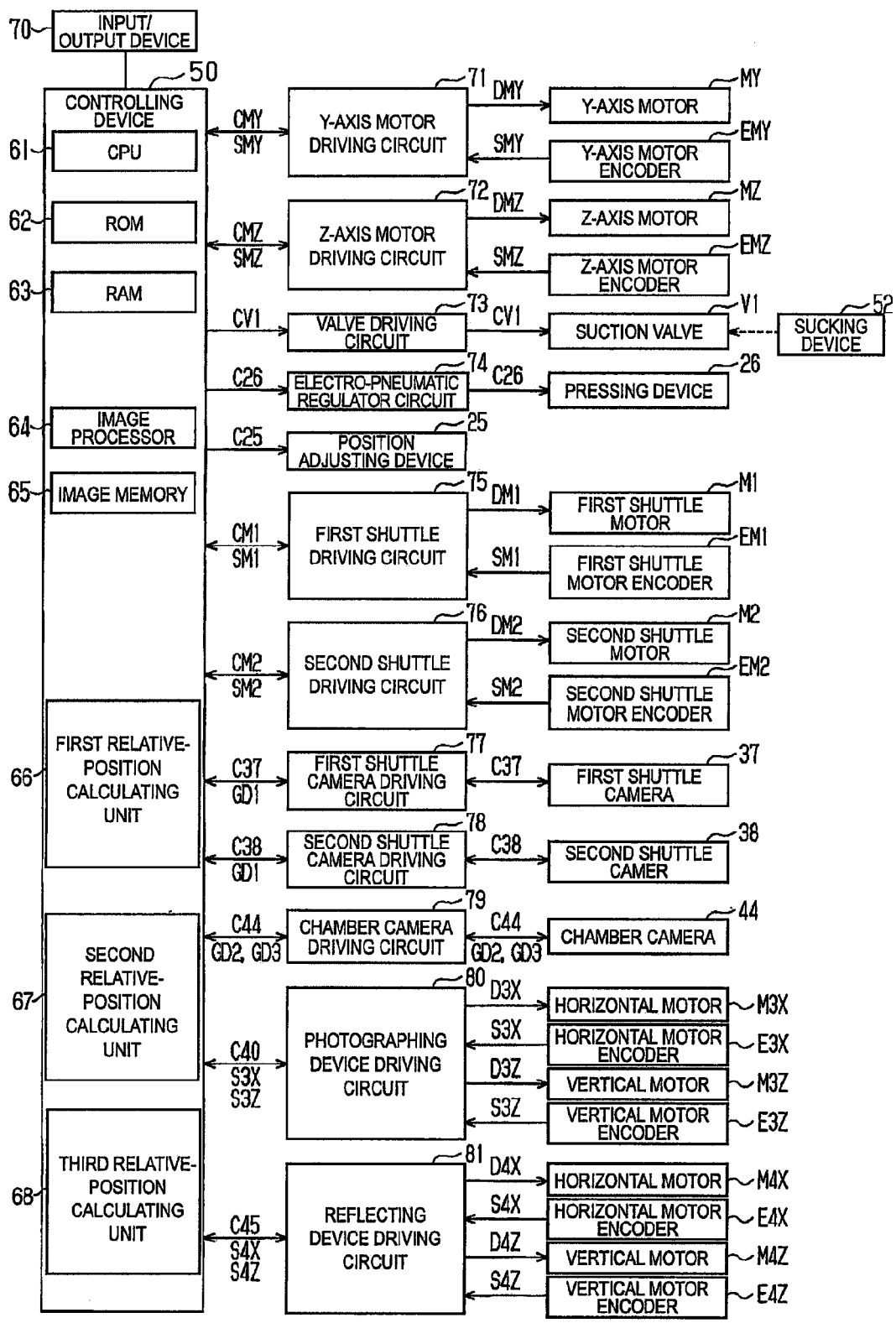
FIG. 10 is a block diagram showing an electrical structure of the IC handler of the embodiment.

Next, FIG. 10 will be referred to describe an electrical structure of the IC handler 10 that suitably mounts the IC chip T in the inspection socket 24.

The IC handler 10 includes a controlling device 50 including first to third relative-position calculating units 66-68, respectively.

In FIG. 10, the controlling device 50 includes a CPU 61, a ROM 62, a RAM 63, an image processor 64, and an image memory 65. According to various data and various control programs stored in the ROM 62 and the RAM 63, the controlling device 50 (the CPU 61) performs, for example, a processing that allows the IC handler to suck, hold, and extract an IC chip T before inspection from the pocket 32 of the supply change kit 31 to mount the chip in the inspection socket 24. In the present embodiment, the RAM 63 includes an inspected-product counter memory that stores the counts of the IC chips T inspected.

The controlling device 50 is electrically connected to an input/output device 70. The input/output device 70 has various switches and a condition display unit to output a command signal for starting execution of each of the foregoing processings, initial value data for executing each processing, and the like, to the controlling device 50.

The controlling device 50 is also electrically connected to a Y-axis motor driving circuit 71 and a Z-axis motor driving circuit 72, respectively.

The Y-axis motor driving circuit 71 receives a control signal CMY from the controlling device 50 and generates a driving signal DMY based on the control signal CMY to drivingly control the Y-axis motor MY by using the driving signal DMY. Additionally, the controlling device 50 receives a rotation amount SMY of the Y-axis motor MY detected by a Y-axis motor encoder EMY via the Y-axis motor driving circuit 71. Thereby, the controlling device 50 acquires the position of the measuring robot 22 based on the rotation amount SMY. In short, the controlling device 50 drivingly controls the Y-axis motor MY to locate the pressing and retaining portion 22C at the position above the inspection socket 24 and the position above the first shuttle 16 or the second shuttle 17.

The Z-axis motor driving circuit 72 receives a control signal CMZ from the controlling device 50 and generates a driving signal DMZ based on the control signal CMZ to drivingly control the Z-axis motor MZ by using the driving signal DMZ. Additionally, the controlling device 50 receives a rotation amount SMZ of the Z-axis motor MZ detected by a Z-axis motor encoder EMZ via the Z-axis motor driving circuit 72. Thereby, the controlling device 50 acquires the position of the pressing and retaining portion 22C based on the rotation amount SMZ. In short, the controlling device 50 drivingly controls the Z-axis motor MZ to locate the pressing and retaining portion 22C (the suction nozzle 27) at the initial position as the descending-movement starting position via the connecting portion 22B.

The controlling device 50 is electrically connected to a valve driving circuit 73. The valve driving circuit 73 drivingly controls the suction valve V1 based on a control signal CV1 input from the controlling device 50. The controlling device 50 drivingly controls the suction valve V1 to switch the connection of the suction hole of the suction nozzle 27 to either the sucking device 52 or the atmosphere. When the suction hole is connected to the sucking device 52, the IC chip T is sucked and hold by an opening end of the suction nozzle 27.

The controlling device 50 is also electrically connected to an electro-pneumatic regulator circuit 74 corresponding to the pressing device 26. Based on a control signal C26 input from the controlling device 50, the electro-pneumatic regulator circuit 74 moves the pressing device 26 (the suction nozzle 27) from the initial position as the descending-movement starting position to a lower suction starting position or a lower mounting position with respect to the pressing and retaining portion 22C by using an atmospheric pressure.

The controlling device 50 is electrically connected to the position adjusting device 25 of the pressing and retaining portion 22C. Based on a control signal C25 input from the controlling device 50, the position adjusting device 25 controls to move the pressing device 26 (the suction nozzle 27) in the right and left directions (the X direction) and the front and back directions (the Y direction) with respect to the pressing and retaining portion 22C, as well as controls to rotate the suction nozzle 27 around the center axis of the nozzle as a rotation center with respect to the horizontal plane (the XY plane).

The controlling device 50 is electrically connected to a first shuttle driving circuit 75 and a second shuttle driving circuit 76, respectively.

The first shuttle driving circuit 75 receives a control signal CM1 from the controlling device 50 and generates a driving signal DM1 based on the control signal CM1 to drivingly control the first shuttle motor M1 by using the driving signal DM1. Then, the controlling device 50 drives the first shuttle motor M1 to move the first shuttle 16 along the rail 30A. In addition, the controlling device 50 receives a rotation amount SM1 of the first shuttle motor M1 detected by a first shuttle encoder EM1 via the first shuttle driving circuit 75. Thereby, the controlling device 50 acquires the position of the first shuttle 16 based on the rotation amount SM1.

The second shuttle driving circuit 76 receives a control signal CM2 from the controlling device 50 and generates a driving signal DM2 based on the control signal CM2 to drivingly control the second shuttle motor M2 by using the driving signal DM2. The controlling device 50 also drives the second shuttle motor M2 to move the second shuttle 17 along the rail 30B. In addition, the controlling device 50 receives a rotation amount SM2 of the second shuttle motor M2 detected by a second shuttle encoder EM2 via the second shuttle driving circuit 76. Thereby, the controlling device 50 acquires the position of the second shuttle 17 based on the rotation amount SM2.

The controlling device 50 is also electrically connected to a first shuttle camera driving circuit 77, a second shuttle camera driving circuit 78, and a chamber camera driving circuit 79, respectively.

Based on a control signal C37 input from the controlling device 50, the first shuttle camera driving circuit 77 drivingly controls the first shuttle camera 37. Then, the controlling device 50 drivingly controls the first shuttle camera 37 to acquire image data GD1 for a "device recognition processing" obtained by the first shuttle camera 37. Next, the controlling device 50 uses the acquired image data GD1 to allow the image processor 64 to perform the image recognition processing (the device recognition processing) of the IC chip T sucked to the suction nozzle 27 and the first and the second bottom surface hand marks 280 and 281.

Figure 11:
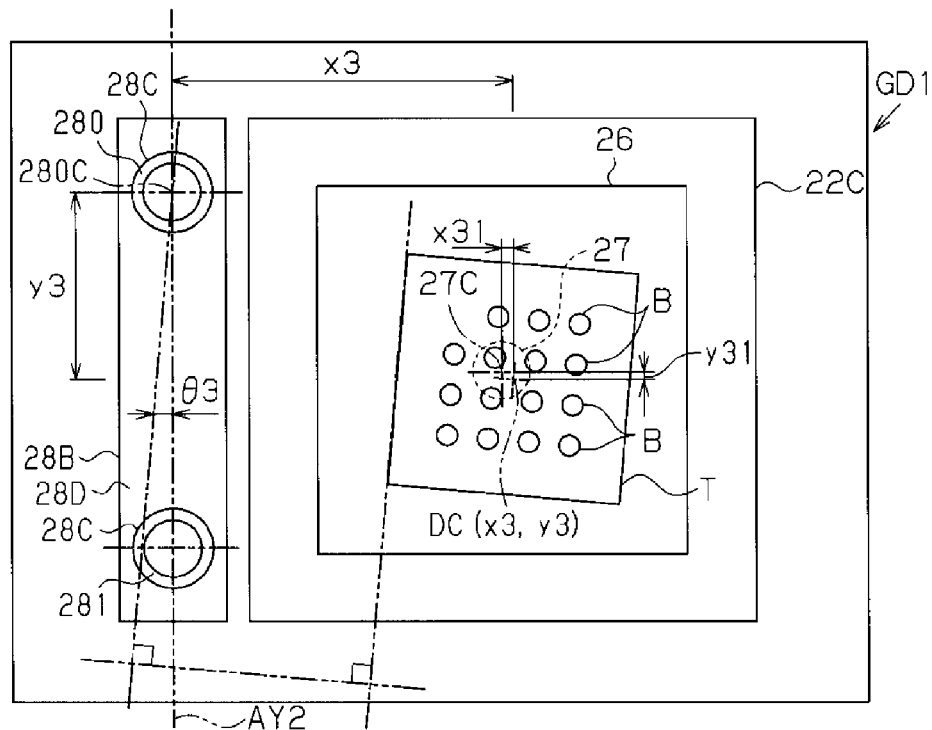
FIG. 11 is an illustrative view illustrating a device recognition processing of the embodiment.

As shown in FIG. 11, in the device recognition processing, a center position 280C of the first bottom surface hand mark 280 is set as an original point to calculate relative coordinates (x3, y3) that describe a third relative position of the center position DC of the IC chip T with respect to the original point. Additionally, a center position 27C of the suction nozzle 27 is set as an original point to calculate coordinates (x31, y31) that describe a sucking position deviation of the center position DC of the IC chip T with respect to the original point.

In addition, the device recognition processing is performed to calculate an angular deviation θ3 that indicates a third relative position of the first side of the IC chip T with respect to the hand mark arrangement line AY2, namely, a rotation amount of the first side of the IC chip T corresponding to the hand mark arrangement line AY2.

Furthermore, the controlling device 50 stores the calculated relative coordinates (x3, y3), the sucking position deviation (x31, y31), and the angular deviation θ3 in the RAM 63. For calculation convenience, each value of the relative coordinates (x3, y3) and the angular deviation θ3 is given based on a coordinate system used when the measuring robot 22 is viewed from an upper side. Additionally, a relative position of the first bottom surface hand mark 280 with respect to the measuring robot 22 is the same as that of the first top surface hand mark 282 with respect to the robot 22. Thus, the center of the first top surface hand mark 282 is equal to the center position 280C, and the values of the relative coordinates (x3, y3) are the same for both the first bottom surface hand mark 280 and the first top surface hand mark 282.

Based on a control signal C38 input from the controlling device 50, the second shuttle camera driving circuit 78 drivingly controls the second shuttle camera 38. Then, the controlling device 50 drivenly controls the second shuttle camera 38 to acquire the image data GD1 for the "device recognition processing" obtained by the second shuttle camera 38. The controlling device 50 uses the acquired image data GD1 to allow the image processor 64 to perform the image recognition processing (the device recognition processing) of the IC chip T sucked to the suction nozzle 27 and the first and second bottom surface hand marks 280 and 281. Then, as shown in FIG. 11, the "device recognition processing" is performed, where the processing is the same as above and thus a description thereof will be omitted.

Based on a control signal C44 input from the controlling device 50, the chamber camera driving circuit 79 drivingly controls the chamber camera 44. Then, the controlling device 50 drivingly controls the chamber camera 44 to acquire image data GD2 for a "mark-position recognition processing" or image data GD3 for a "socket recognition processing" obtained by the chamber camera 44.

The controlling device 50 uses the acquired image data GD2 for the "mark-position recognition processing" to allow the image processor 64 to perform an image recognition processing (the mark recognition processing) of the first and the second socket marks 260, 261 and the first and the second top surface hand marks 282, 283.

Figure 12:
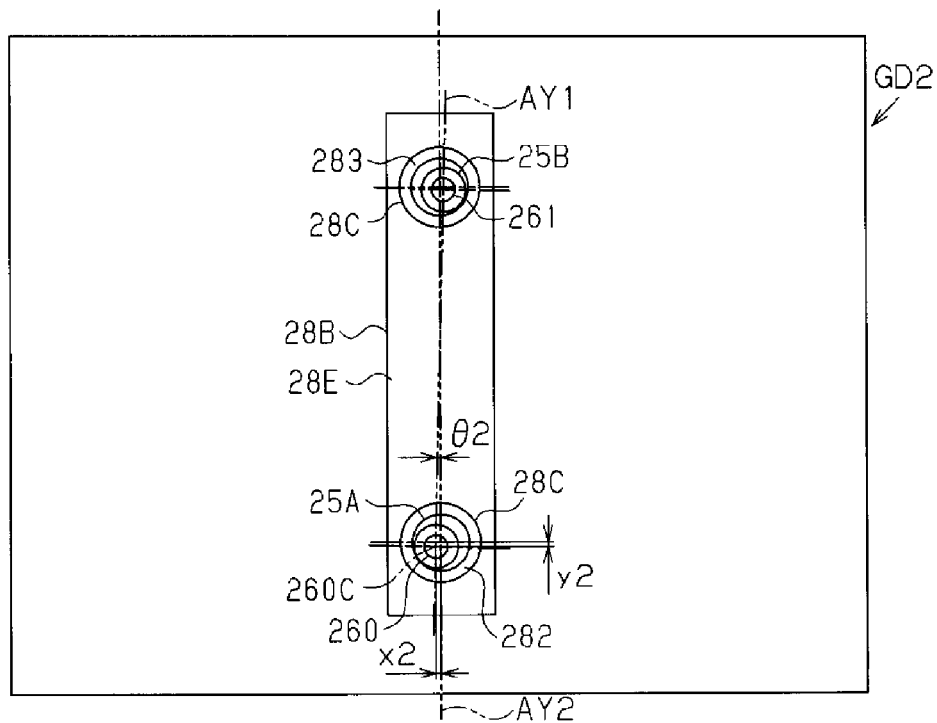
FIG. 12 is an illustrative view illustrating a mark-position recognition processing of the embodiment.

As shown in FIG. 12, in the above mark recognition processing, a center position 260C of the first socket mark 260 is set as an original point to calculate relative coordinates (x2 and y2) that describe a second relative position of the center position 280C of the first top surface hand mark 282 with respect to the original point, namely, a positional deviation of the hand mark 282 with respect to the first socket mark 260.

Additionally, the mark-position recognition processing is performed to calculate the angular deviation θ2 indicating a second relative position of the hand mark arrangement line AY2 with respect to the socket pin arrangement line AY1. Then, the controlling device 50 stores the relative coordinates and the angular deviation calculated above in the RAM 63.

Furthermore, the controlling device 50 allows the image processor 64 to perform an image recognition processing (the socket recognition processing) of the first and the second socket marks 260, 261 and the first and the inspection socket 24 by using the acquired image data GD3 for the "socket recognition processing".

Figure 13:
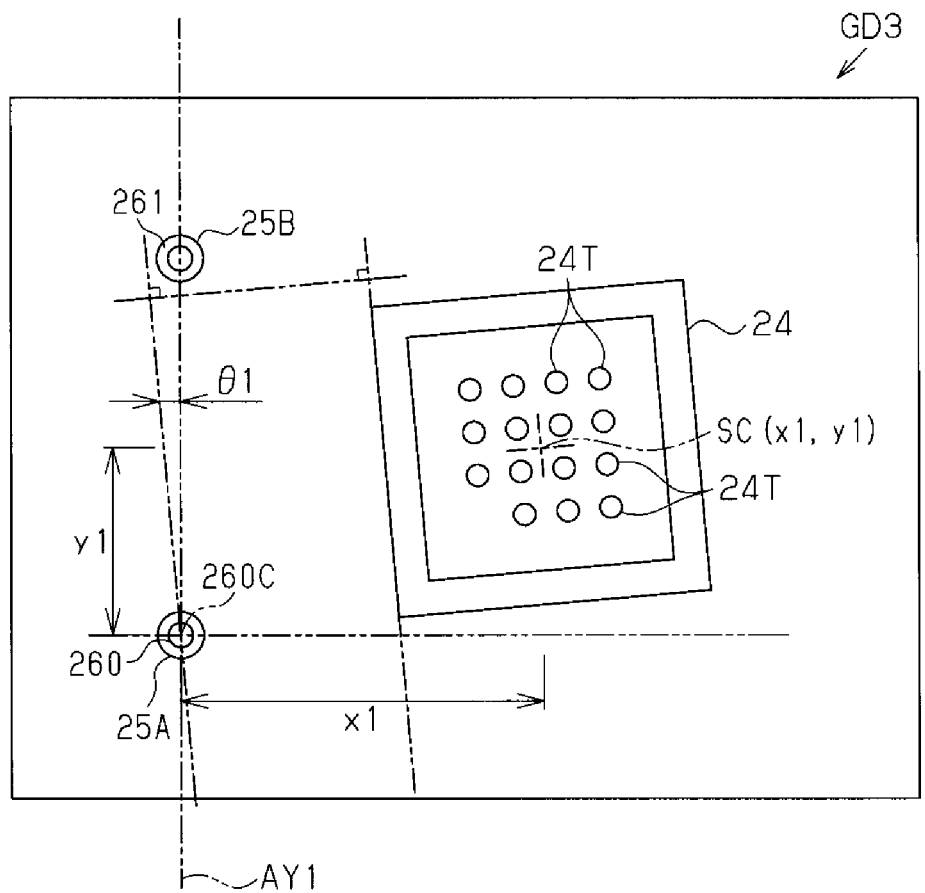
FIG. 13 is an illustrative view illustrating a socket recognition processing of the embodiment.
Figure 14:
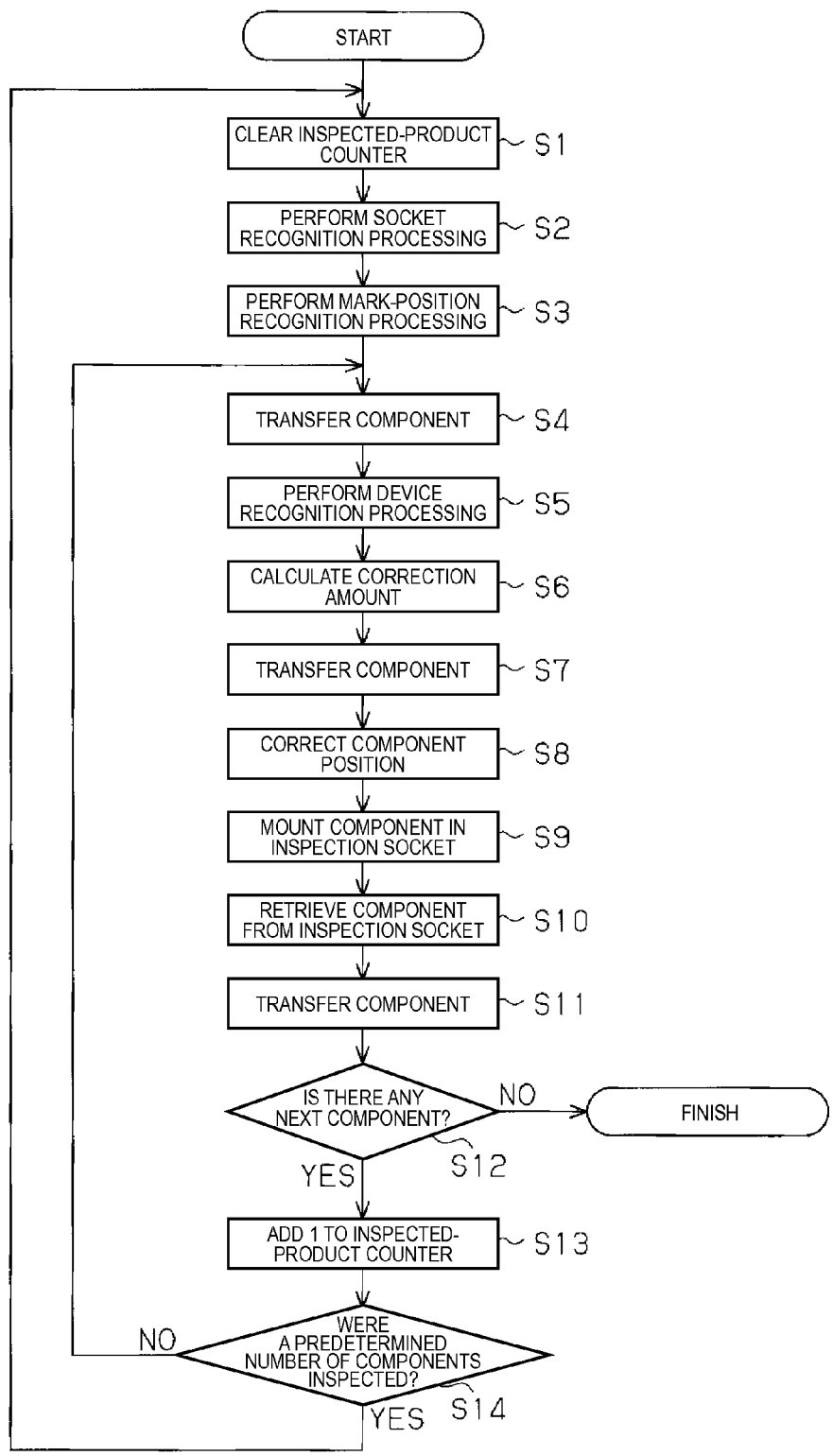
FIG. 14 is a flowchart showing an example of a processing for transferring an IC chip T of the embodiment to inspect the chip.

As shown in FIG. 13, in the socket recognition processing, the center position 260C of the first socket mark 260 is set as an original point to calculate relative coordinates (x1 and y1) describing a first relative position of the center position SC of the inspection socket 24 with respect to the original point.

Additionally, the socket recognition processing is also performed to calculate an angular deviation θ1 indicating a first relative position of the first side of the inspection socket 24 with respect to the socket pin arrangement line AY1, namely, a rotation amount of the first side of the inspection socket 24 corresponding to the socket pin arrangement line AY1 in the X direction and the Y direction, respectively. Then, the controlling device 50 stores the relative coordinates and the angular deviation calculated above in the RAM 63.

Specifically, the controlling device 50 applies a rotational correction to the relative coordinates (x3, y3) of the center position DC of the IC chip T by the angular deviation θ2, and adds the relative coordinates (x2, y2) of the center position 280C of the first top surface hand mark 282 to calculate relative positional coordinates (x23, y23) of the IC chip T with respect to the first socket mark 260. Additionally, the controlling device 50 adds the angular deviation θ2 of the hand mark arrangement line AY2 to the angular deviation θ3 of the IC chip T to calculate a relative angular deviation θ23 with respect to the socket pin arrangement line AY1.

Furthermore, the controlling device 50 subtracts the calculated relative positional coordinates (x23, y23) from the relative coordinates (x1 and y1) of the center position SC of the inspection socket 24 to calculate a positional deviation amounts (Δx, Δy) of the center position DC of the IC chip T with respect to the center position SC of the inspection socket 24. Additionally, the controlling device 50 subtracts the calculated relative angular deviation θ23 from the angular deviation θ1 of the inspection socket 24 to calculate an angular deviation amount Δθ of the IC chip T with respect to the inspection socket 24.

Based on the positional deviation amounts (Δx, Δy), the angular deviation amount Δθ, and the sucking position deviation (x31, y31), the controlling device 50 makes the center position DC of the IC chip T coincident with the center position SC of the inspection socket 24, as well as calculates the amounts of movements (the amounts of corrections) of the suction nozzle 27 in the X and the Y directions and the rotation angle so as to allow the angular deviation amount Δθ to be "zero". Then, the controlling device 50 inputs a control signal C25 calculated based on the correction amounts to the position adjusting device 25 to allow the suction nozzle 27 to rotate and move in the X and the Y directions so as to make the center position DC of the IC chip T coincident with the center position SC of the inspection socket 24, namely, so as to correct the position of the IC chip T.

The controlling device 50 is electrically connected to a photographing device driving circuit 80 and a reflecting device driving circuit 81, respectively.

The photographing device driving circuit 80 generates a driving signal D3X for the right and left directions (the X direction) and a driving signal D3Z for the upper and lower directions (the Z direction) based on a control signal C40 from the controlling device 50. Then, based on the driving signal D3X, the horizontal motor M3X is drivingly controlled to move the photographing device 40 (the chamber camera 44) in the right and left directions. Additionally, based on the driving signal D3Z, the vertical motor M3Z is drivingly controlled to move the photographing device 40 (the chamber camera 44) in the upper and lower directions. Furthermore, the controlling device 50 receives a rotation amount S3X of the horizontal motor M3X detected by a horizontal motor encoder E3X via the photographing device driving circuit 80. Thereby, the controlling device 50 acquires the position of the chamber camera 44 in the right and left directions (the X direction) from the rotation amount S3X. Additionally, the controlling device 50 receives a rotation amount S3Z of the vertical motor M3Z detected by a vertical motor encoder E3Z via the photographing device driving circuit 80. Thereby, the controlling device 50 acquires the position of the chamber camera 44 in the upper and lower directions (the Z direction) from the rotation amount S3Z.

Based on a control signal C45 input from the controlling device 50, the reflecting device driving circuit 81 generates a driving signal D4X for the right and left directions (the X direction) and a driving signal D4Z for the upper and lower directions (the Z direction). Based on the driving signal D4X, the horizontal motor M4X is drivingly controlled to move the reflecting device 45 (the second mirror 49A) in the right and left directions. Additionally, based on the driving signal D4Z, the vertical motor M4Z is drivingly controlled to move the reflecting device 45 (the second mirror 49A) in the upper and lower directions. The controlling device 50 receives a rotation amount S4X of the horizontal motor M4X detected by a horizontal motor encoder E4X via the reflecting device driving circuit 81. Thereby, the controlling device 50 acquires the position of the second mirror 49A in the right and left directions (the X direction) from the rotation amount S4X. Furthermore, the controlling device 50 receives a rotation amount S4Z of the horizontal motor M4Z detected by a horizontal motor encoder E4Z via the reflecting device driving circuit 81. Thereby, the controlling device 50 acquires the position of the second mirror 49A in the upper and lower directions (the Z direction) from the rotation amount S4Z.

Next, FIGS. 14 to 17 will be referred to describe a series of steps for transferring the sucked and hold IC chip T from the first shuttle 16 to the inspection socket 24, in the IC handler 10. In this case, the inspection of the IC chip T is about to be started, and the IC chip T is yet to be sucked and hold by the measuring robot 22.

First, upon a start of the inspection of the IC chip T, the controlling device 50 clears the inspected-product counter memory to "zero". The counter memory records the numbers of the IC chips inspected (Step S1). After clearing the counter memory to "zero", the controlling device 50 performs the socket recognition processing (Step S2).

Figure 15:
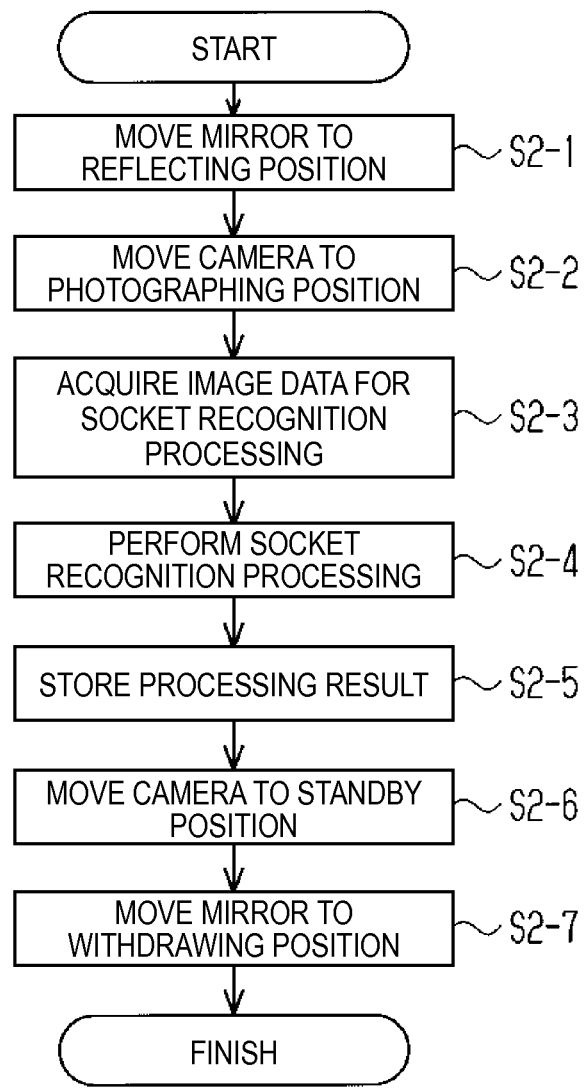
FIG. 15 is a flowchart showing a socket recognition processing of the IC handler of the embodiment.

In the socket recognition processing, as shown in FIG. 15, the controlling device 50 moves the second mirror 49A to the reflecting position RP (Step S2-1) and moves the chamber camera 44 to the second photographing position CP2 (Step S2-2). When the chamber camera 44 is moved to the second photographing position CP2, the controlling device 50 allows the chamber camera 44 to photograph the first and the second socket marks 260, 261 and the inspection socket 24 to acquire the image data GD3 for the socket recognition processing (Step S2-3).

After acquiring the image data GD3 for the socket recognition processing, the controlling device 50 performs the socket recognition processing to calculate the relative coordinates (x1, y1) and the angular deviation θ1 (Step S2-4) so as to store the calculated relative coordinates and the angular deviation in the RAM 63 (Step S2-5). After storing the coordinates and the angular deviation above in the RAM 63, the controlling device 50 moves the chamber camera 44 to the standby position (Step S2-6), and then, moves the second mirror 49A to the withdrawing position (Step S2-7) to complete the socket recognition processing.

Following the completion of the socket recognition processing, the controlling device 50 performs the mark-position recognition processing (Step S3).

Figure 16:
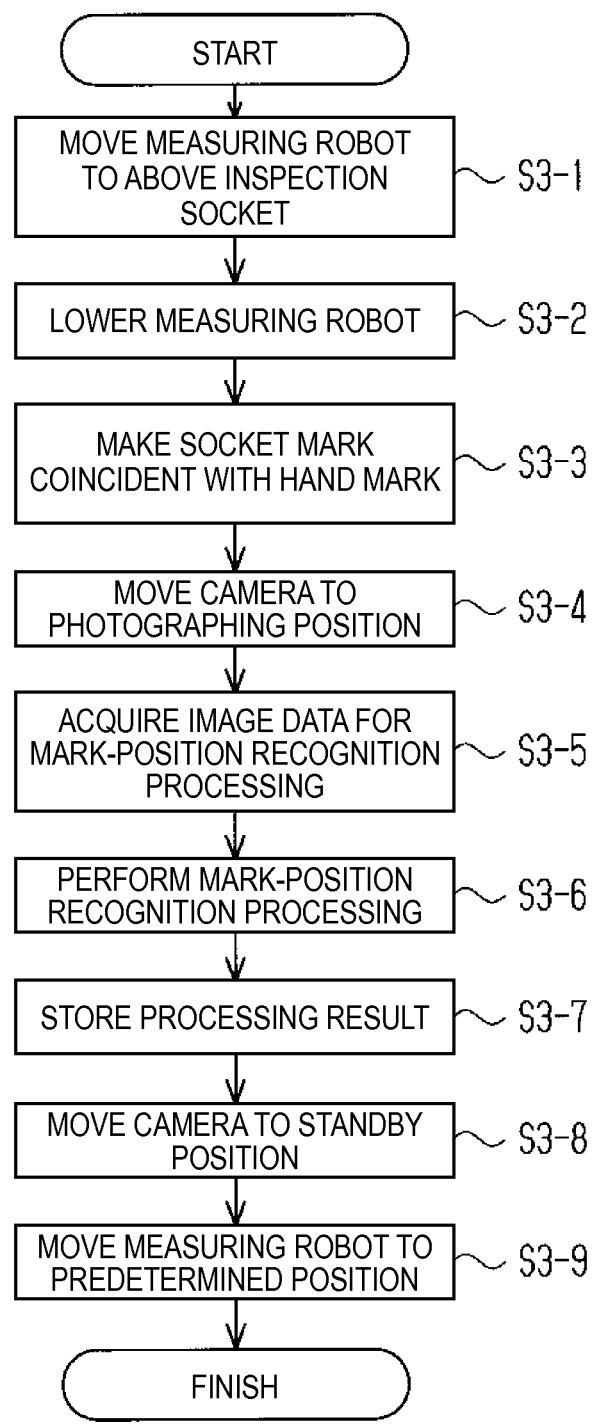
FIG. 16 is a flowchart showing a mark recognition processing of the IC handler of the embodiment.

In the mark-position recognition processing, as shown in FIG. 16, the controlling device 50 moves the measuring robot 22 to above the inspection socket 24 (Step S3-1), and then lowers the measuring robot 22 (Step S3-2). After the measuring robot 22 descends, the socket pins 25A and 25B, respectively, are inserted in the corresponding cylindrical members 28C, respectively. When the measuring robot 22 lowers the pressing and retaining portion 22C to the original point, the top surface positions of the top surface hand marks 282 and 283 corresponding to the socket marks 260 and 261 are made coincident with those of the socket marks 260 and 261 (Step S3-3). After that, the controlling device 50 moves the chamber camera 44 to the second photographing position CP2 (Step S3-4). When the chamber camera 44 moves to the position CP2, the controlling device 50 allows the chamber camera 44 to photograph the socket marks 260, 261 and the corresponding top surface hand marks 282, 283 via the first mirror 29A provided on the left side surface of the measuring robot 22 to acquire the image data GD2 for the mark-position recognition processing (Step S3-5).

After acquiring the image data GD2 for the mark-position recognition processing, the controlling device 50 performs the mark-position recognition processing to calculate the relative coordinates (x2, y2) and the angular deviation $\theta 2$ (Step S3-6) so as to store the calculated relative coordinates and the angular deviation in the RAM 63 (Step S3-7). After storing the coordinates and the angular deviation above in the RAM 63, the controlling device 50 moves the chamber camera 44 to the standby position (Step S3-8) and moves the measuring robot 22 to a predetermined position (Step S3-9) to complete the mark-position recognition processing.

Upon the completion of the mark-position recognition processing, the controlling device 50 supplies the IC chip T to each pocket 32 of the supply change kit 31 of the first shuttle 16 to transfer the IC chip T to the position where the chip is sucked and hold by the measuring robot 22 (Step S4). When the measuring robot 22 transfers the IC chip T to the sucking and holding position, the controlling device 50 performs the device recognition processing (Step S5).

Figure 17:
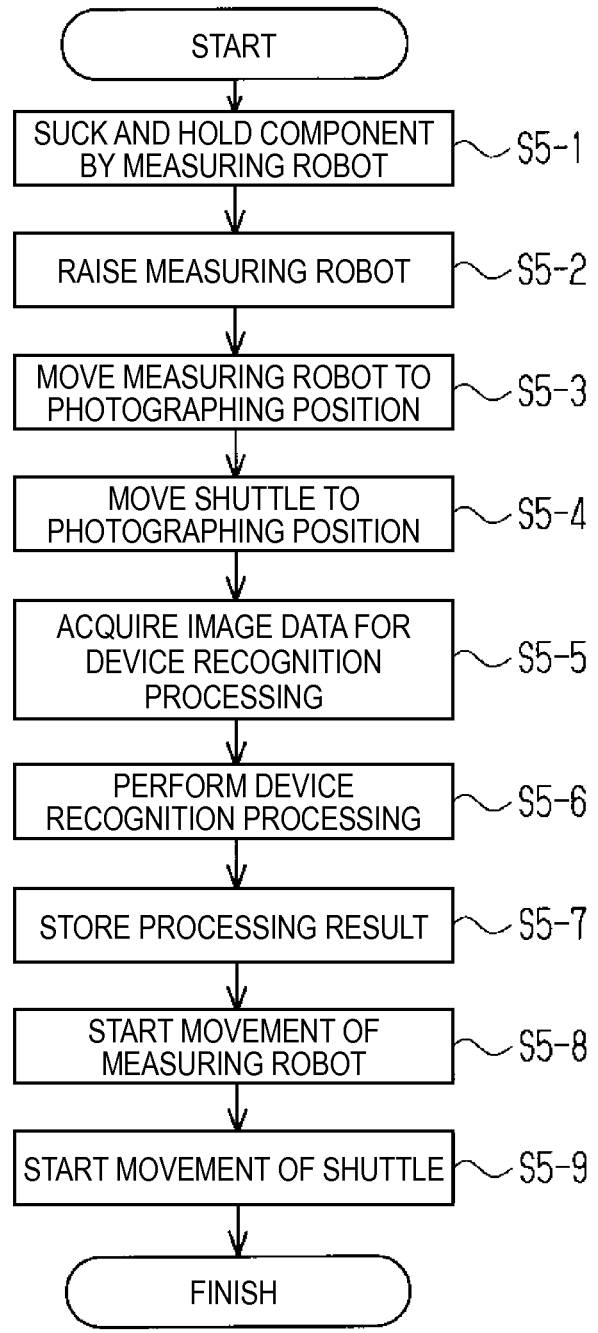
FIG. 17 is a flowchart showing a device recognition processing of the IC handler of the embodiment.

In the device recognition processing, the suction nozzle 27 is located at a predetermined initial position and at a predetermined initial angle with respect to the measuring robot 22. Then, as shown in FIG. 17, the suction nozzle 27 of the measuring robot 22 is lowered to the sucking position to allow the measuring robot 22 to suck and hold the IC chip T (Step S5-1). When the IC chip T is sucked and hold by the measuring robot 22, the controlling device 50 raises the measuring robot 22 to move to the first photographing position CP1 where the first shuttle camera 37 photographs the IC chip T and the bottom surface hand marks 280, 281 (Step S5-3). After moving the measuring robot 22 to the position CP1, the controlling device 50 moves the first shuttle 16 to move the first shuttle camera 37 to the first photographing position CP1 (Step S5-4). When the measuring robot 22 and the first shuttle camera 37 are moved to the first photographing position CP1, the controlling device 50 allows the first shuttle camera 37 to photograph the IC chip T and the bottom surface hand marks 280 and 281 so as to acquire the image data GD1 for the device recognition processing (Step S5-5).

When acquiring the image data GD1 for the device recognition processing, the controlling device 50 performs the device recognition processing. In the processing, the controlling device 50 calculates the sucking position deviation (x31, y31), the relative coordinates (x3, y3), and the angular deviation $\theta 3$ (Step S5-6) to store in the RAM 63 (Step S5-7). Thereafter, the controlling device 50 starts to move the measuring robot 22 to mount the IC chip T in the inspection socket 24 (Step S5-8). After starting the movement of the measuring robot 22, the controlling device 50 starts to move the first shuttle 16 to a position for retrieving the IC chip T (Step S5-9) to finish the device recognition processing.

Upon the completion of the device recognition processing, the controlling device 50 calculates the amounts of correction for making the central position DC of the IC chip T coincident with the center position SC of the inspection socket 24 based on the relative coordinates (x1, y1), (x2, y2), and (x3, y3) and the angular deviations $\theta 1$, $\theta 2$, and $\theta 3$ stored in the RAM 63 (Step S6).

In the calculation of the correction amounts, the controlling device 50 makes the center position DC of the chip coincident with the center position SC of the socket based on the sucking position deviation, the relative coordinates, and the angular deviations, as well as calculates the amounts of movements (the correction amounts) of the suction nozzle 27 in the X and the Y directions and the rotational angle so as to allow the angular deviation amount $\Delta\theta$ to be "zero". After calculating the correction amounts, the controlling device 50 allows the measuring robot 22 to transfer the IC chip T to above the inspection socket 24 (Step S7).

After transferring the IC chip T to above the socket, the controlling device 50 moves the position adjusting device 25 based on the calculated correction amounts to make the center position DC of the IC chip T coincident with the center position SC of the socket and also performs a positional correction to make an inclination of the first side of the IC chip T coincident with an inclination of the first side of the socket (Step S8).

After correcting the positional the IC chip T, the controlling device 50 mounts the IC chip T in the inspection socket 24 (Step S9) to perform an electrical inspection of the IC chip T. Upon the completion of the electrical inspection of the chip, the controlling device 50 allows the suction nozzle 27 to be located at the predetermined initial position and at the predetermined initial angle with respect to the measuring robot 22, and allows the measuring robot 22 to extract the IC chip T from the inspection socket 24 to retrieve the chip and place in each pocket 32 of the retrieval change kit 34 of the first shuttle 16 (Step S10).

After placing the IC chip T in the retrieval change kit 34, the controlling device 50 moves the first shuttle 16 to allow the retrieving robot 15 to retrieve the chip. After the IC chip T is retrieved by the retrieving robot 15, the controlling device 50 determines whether there is any next chip to be inspected (Step S12).

If there is no next chip to be inspected (if NO at Step S12), the controlling device 50 finishes the inspection of the IC chip T. Conversely, if there is a next chip to be inspected (if YES at Step S12), the controlling device 50 adds 1 to the inspected-product counter (Step S13) and then determines whether a predetermined number of chips were inspected (Step S14).

When the predetermined number of chips have not been inspected (if NO at Step S14), the controlling device 50 returns to Step S4 to repeat the transfer and inspection of the IC chip T. In this case, the device recognition processing is performed to recalculate the relative coordinates (x3, y3) and the angular deviation $\theta 3$, whereas the socket recognition processing and the mark-position recognition processing are not performed. Thus, correction values are calculated using the relative coordinates (x2, y2) and (x1, y1) and the angular deviations $\theta 1$ and $\theta 2$ previously calculated and stored in the RAM 63. Meanwhile, when the predetermined number of chips have been inspected (if YES at Step S14), the controlling device 50 returns to Step S1 to perform the socket recognition processing, the mark-position recognition processing, and the device recognition processing, whereby correction values are calculated to repeat the inspection of the IC chip T.

In addition, the IC handler 10 is also used to suck and hold the IC chip T from the second shuttle 17 to mount the chip in the inspection socket 24. A series of steps performed are the same as those in the first shuttle 16. Thus, a description of the steps using the second shuttle 17 will be omitted.

As described hereinabove, the component transferring apparatus and the IC handler according to the embodiment of the invention provide advantages as follows.

1. In the present embodiment, there are provided the first and the second socket marks 260 and 261. The socket marks 260, 261 and the inspection socket 240 are photographed to perform the image recognition processing of the image data GD3 obtained by the photographing operation. The image recognition processing provides the relative coordinates (x1, y1) of the inspection socket 24 with respect to the first socket mark 260 and the angular deviation 81 of the socket with respect to the socket pin arrangement line AY1. As a result, even if installation-induced distortion and thermal expansion and contraction occur in the IC handler 10, the relative positional relationship between the inspection socket 24 and the first socket mark 260 can be obtained in such a manner as to reflect physical changes such as the distortion and the expansion and contraction as mentioned above.

2. In the embodiment, the first and the second top surface hand marks 282, 283, respectively, are provided to be inserted in the first and the second socket marks 260, 261, respectively. Thus, the socket mars 260, 261 and the corresponding hand marks 282, 283 are photographed to perform the image recognition processing of the image data GD2 obtained by the photographing operation. The image recognition processing provides the relative coordinates (x2, y2) of the first top surface hand mark 282 with respect to the first socket mark 260 and the angular deviation θ2 of the hand mark arrangement line AY2 with respect to the socket pin arrangement line AY1. As a result, even if installation-induced distortion and thermal expansion and contraction occur in the IC handler 10, there can be obtained an appropriate relative positional relationship between the first top surface hand mark 282 and the first socket mark 260, namely, an appropriate relative positional relationship between the inspection section 23 and the measuring robot 22.

In the embodiment, the relative coordinates (x1, y1) and the angular deviation 81 are obtained from the image data GD3 for the socket recognition processing; the relative coordinates (x2, y2) and the angular deviation θ2 are obtained from the image data GD2 for the mark-position recognition processing; and the relative coordinates (x3, y3) and the angular deviation θ3 are obtained from the image data GD1 for the device recognition processing. Based on the relative coordinates (x1, y1), (x2, y2), and (x3, y3) and the angular deviation θ2, there is calculated the positional deviation amounts (Δx, Δy) between the center position SC of the inspection socket 24 and the center position DC of the IC chip T. Additionally, based on the angular deviations θ1, θ2, and θ3, there is calculated the angular deviation amount Δθ between the first side of the inspection socket 24 and the first side of the IC chip T. As a result, the relative positions of the inspection socket 24 and the IC chip T can be made coincident with each other, whereby the position of the IC chip T can be adjusted such that the angular deviation amount is made "zero".

4. In the embodiment, the first and the second top surface hand marks 282, 283, respectively, are provided to be inserted in the first and the second socket marks 260, 261, respectively, where the hand marks and the socket marks have the same height. Thus, the chamber camera 44 can photograph all of the marks at one time. Additionally, in the image recognition processing in which the margin of error becomes larger if there is any difference in a height direction, the relative positional relationship between the socket marks 260, 261 and the corresponding top surface hand marks 282, 283 can be recognized with a high precision so as to calculate the relative positions and the angular deviation.

5. In the embodiment, the chamber camera 44 photographs the image data GD2 for the "mark-position recognition processing" and the image data GD3 for the "socket recognition processing". In this manner, the single camera is used to photograph both of the two image data, and thus, the number of cameras can be reduced. Additionally, since the chamber camera 44 photographs those images via the first and second mirror 29A and 49A, respectively, the camera can be easily located on a periphery of the measuring robot 22 and the inspection section 23 in which the location position for the camera is very limited.

6. In the embodiment, the "device recognition processing" is performed for each IC chip T, whereas the "mark-position recognition processing" and the "socket recognition processing" are performed every time a predetermined number of the IC chips T are inspected. This can reduce the number of times of the image recognition processings during the steps for inspecting the IC chip T, which can shorten inspection time. Moreover, even if installation-induced distortion and thermal expansion and contraction occur in the IC handler, those changes can be reflected in calculation results of correction values obtained in every inspection of a predetermined number of the chips.

Modifications

For example, modifications of the above embodiment can be implemented as follows.

In the above embodiment, the chamber camera 44 photographs the image for the "mark-position recognition processing" and the image for the "socket recognition processing", respectively, via the first mirror 29A and the second mirror 49A, respectively. However, the images for those recognition processings may be directly photographed by the camera.

In the above embodiment, the chamber camera 44 photographs the image for the "mark-position recognition processing" and the image for the "socket recognition processing" at the second photographing position CP2. However, those images may be photographed at mutually different positions.

In the above embodiment, the chamber camera 44 is used to photograph both of the image for the "mark-position recognition processing" and the image for the "socket recognition processing". However, an exclusive camera for each of the images may be used to photograph each image.

In the above embodiment, there are provided the two socket marks 260, 261 and the two cylindrical members 28C. However, the numbers of the socket marks and the cylindrical members (hand marks) are not restricted to two.

In the above embodiment, the socket marks 260, 261 and the hand marks 280 to 283 are circular in shape. However, those marks may be oval, polygonal, or cross-shaped. When such oval, polygonal, or cross-shaped marks are used, an angular deviation can be obtained from a single mark.

In the above embodiment, the socket pins 25A and 25B, respectively, are inserted in the cylindrical members 28C. However, as long as the socket pins and the cylindrical members are arranged within the same viewing range of the camera, the arrangement manner of the pins and the members is not specifically restricted. For example, the socket pins 25A, 25B and the cylindrical members 28C may be adjacently or separately arranged. Additionally, the heights of the socket pins and the cylindrical members are not restricted to the height LSz.

In the above embodiment, the socket pins 25A, 25B and the cylindrical members 28C are each made of metal. However, the hand marks 280 to 283 may be provided on glass, since it is only necessary that the hand marks can be seen from upper and lower sides. In this case, even when the socket marks are superimposed on the hand marks provided on glass, both marks can be photographed together by a camera. Additionally, a hand mark appropriate for an image recognition processing can be easily drawn.

In the above embodiment, the first socket mark 260 is used as a reference point for the relative coordinates. However, the reference point may be provided at any position.

In the above embodiment, the positional deviation amounts ($\Delta x$, $\Delta y$) and the angular deviation amount $A0$ are calculated. However, there may be calculated only a necessary deviation amount among the positional deviation amount in the X direction, the positional deviation amount in the Y direction, and the angular deviation amount.

In the above embodiment, the relative coordinates (x1, y1) and the angular deviation $\theta 1$ are directly calculated by the "socket recognition processing", and the relative coordinates (x2, y2) and the angular deviation $\theta 2$ are directly calculated by the "mark-position recognition processing". Then, based on the calculation results, the positional deviation amounts ($\Delta x$, $\Delta y$) and the angular deviation amount $\Delta \theta$ are calculated. Instead of that, a predetermined processing may be performed using the coordinates calculated by the "socket recognition processing". For example, values calculated by a plurality of times of processings may be stored to obtain an average value in a predetermined number of times of the processings so as to calculate as the relative coordinates (x1, y1). Additionally, a predetermined processing may be performed using the angle calculated by the "socket recognition processing". For example, values calculated by a plurality of times of processings may be stored to obtain an average value in a predetermined number of times of the processings so as to calculate as the angular deviation 81. Furthermore, a predetermined processing as above may also be performed to calculate the relative coordinates (x2, Y2), the angular deviation $\theta 2$, the positional deviation amounts ($\Delta x$, $\Delta y$), or the angular deviation amount $\Delta \theta$.

In the above embodiment, the measuring robot 22 transfers the single IC chip T into the single inspection socket 24. However, the measuring robot 22 may transfer a plurality of IC chips T to mount in a plurality of inspection sockets 24. In this case, the numbers of the shuttle cameras 37, 38, the photographing device 40, and the reflecting device 45 may be singular or plural.

In the above embodiment, in the image recognition processing, the single image including the bottom surface hand marks 280, 281 and the IC chip T is processed as the image data. However, a plurality of image data may be processed at one time. Similarly, the single image including the top surface hand marks 282, 283 and the corresponding socket marks 260, 261, as well as the single image including the socket marks 260, 261 and the inspection socket 24 may also be processed as above in the image recognition processing.

In the above embodiment, when the top surface hand marks 282 and 283 are in contact with the inspection section 23, the top surface positions of the hand marks 282 and 283 are made coincident with those of the socket marks 260 and 261. However, instead of that, the top surface positions of the hand marks and the socket marks may be made coincident with each other in a position separated from the inspection section 23. In this manner, the cylindrical members 28C can be less influenced by a temperature rise in the inspection section 23.

In that case, for example, the measuring robot 22 may be once lowered to the position where the top surface hand marks 282 and 283 contact with the inspection section 23, namely, to the mounting position, and then, may be raised by a predetermined distance. Thereby, while eliminating an influence due to a change in the relative distance between the measuring robot 22 and the inspection section 23, the hand marks 282 and 283 can be located at a position separated from the inspection section 23 by the predetermined distance.

In the above embodiment, every time the IC chip T is transferred to the inspection socket 24, the "device recognition processing" is performed, whereas the "socket recognition processing" and the "mark-position recognition processing" are simultaneously performed every predetermined number of times of the chip transfer. However, an interval for performing the "socket recognition processing" and the "mark-position recognition processing" is not specifically restricted, and those processings may not be simultaneously performed.

Figure 18:
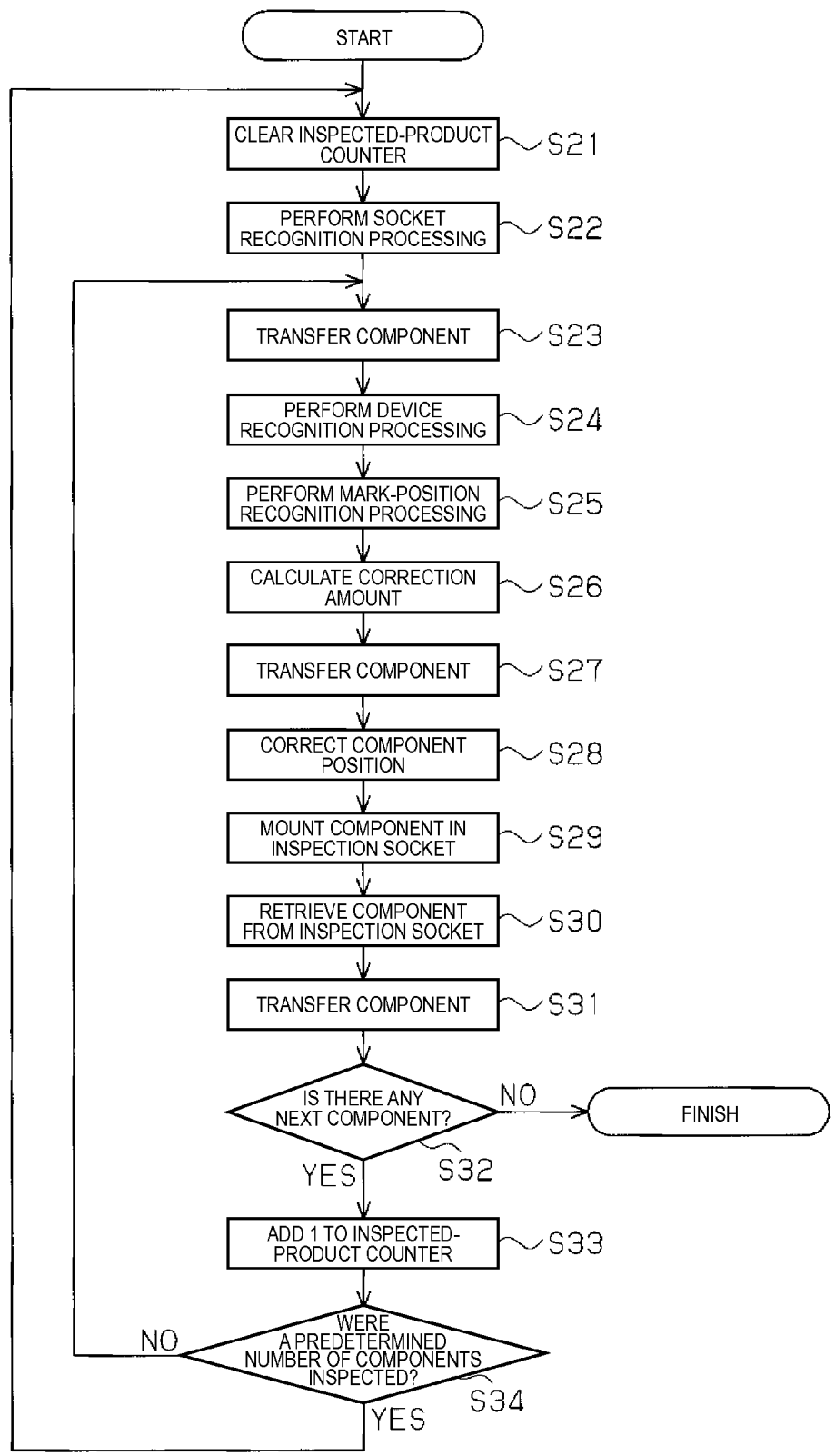
FIG. 18 is a flowchart showing another example of the processing for transferring the IC chip T of the embodiment to inspect the chip.

For example, as shown in FIG. 18, the "mark-position recognition processing" may be performed every after the "device recognition processing".

Figure 19:
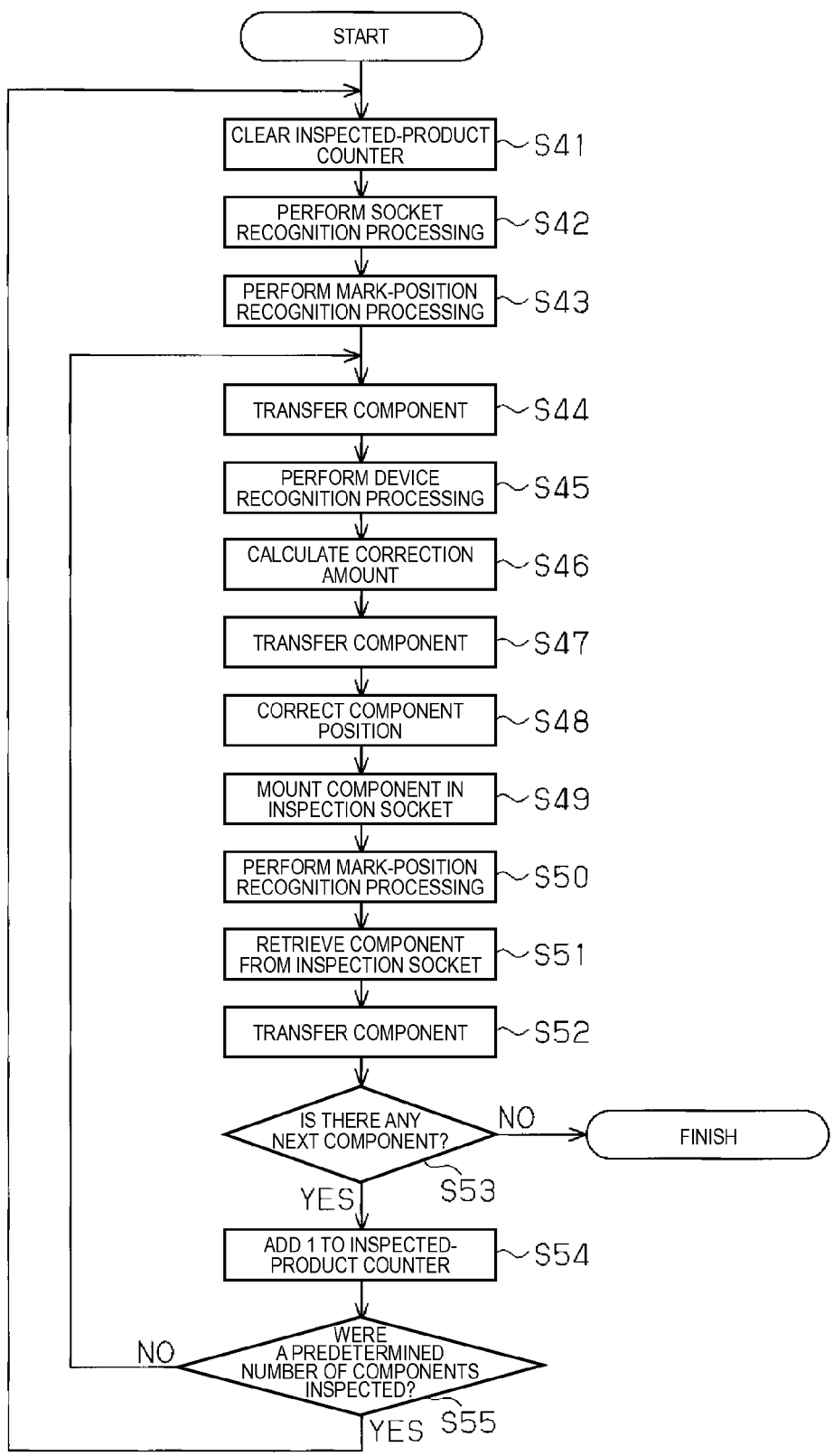
FIG. 19 is a flowchart showing another example of the processing for transferring the IC chip T of the embodiment to inspect the chip.

Additionally, for example, as shown in FIG. 19, when the IC chip T is mounted in the inspection socket 24, the image for the "mark-position recognition processing" may be acquired to perform the "mark-position recognition processing". Next, when mounting the IC chip T in the inspection socket 24, the positional deviation amounts ($\Delta x$, $\Delta y$) and the angular deviation amount $\Delta \theta$ may be calculated based on relative coordinates calculated by the previous "mark-position recognition processing".

What is claimed is:

1. A component transferring apparatus, comprising:
two shuttles that are arranged in parallel to each other and that move in a common direction;
first and second change kits, on which an electronic component is placed, the first and second change kits are respectively provided at both longitudinal ends of each of the shuttles;
an inspection socket;
a supporting board;
a retaining device that moves between each of the shuttles and the inspection socket;
a pressing device included in the retaining device to hold and transfer the electronic component;
a position adjusting device that moves the pressing device to correct a position of the electronic component based on an image processing of image data obtained by photographing of the electronic component;
a socket mark provided in the vicinity of the inspection socket;
a hand mark provided on the retaining device such that the hand mark is positioned in the vicinity of the socket mark when the retaining device is moved to a mounting position where the electronic component held by the pressing device is mounted in the inspection socket;
a first camera provided at a center of each of the shuttles between the first and second change kits to photograph a first single image including the electronic component held by the pressing device and the hand mark provided on the retaining device;
a second camera provided on the supporting board between the shuttles that photographs a second single image including the socket mark and the inspection socket and a third single image including the socket mark and the hand mark of the retaining device moved to the mounting position;

a first relative-position calculating unit that performs an image processing of data obtained by photographing of the second single image including the socket mark and the inspection socket to obtain a first relative position between the socket mark and the inspection socket;

a second relative-position calculating unit that performs an image processing of data obtained by photographing of the third single image including the socket mark and the hand mark located at the mounting position to obtain a second relative position between the socket mark and the hand mark; and a third relative-position calculating unit that performs an image processing of data obtained by photographing of the first single image including the electronic component and the hand mark to obtain a third relative position between the hand mark and the electronic component, wherein based on the first, the second, and the third relative positions, the position adjusting device corrects the position of the electronic component to mount the electronic component in the inspection socket.

2. The component transferring apparatus according to claim 1, further comprising a first mirror that is provided on the retaining device so as to reflect the socket mark and the hand mark located at the mounting position in a direction of the second camera and a second mirror that reflects the socket mark and the inspection socket in the direction of the second camera at a reflecting position above the inspection socket, wherein the second camera is located at a position where the single image including the socket mark and the inspection socket cannot be directly photographed and also located at a position where the single image including the socket mark and the hand mark located at the mounting position cannot be directly photographed, as well as the second camera photographs the single image including the socket mark and the hand mark via the first mirror located at the mounting position and also photographs the single image including the socket mark and the inspection socket via the second mirror located at the reflecting position.

3. The component transferring apparatus according to claim 1, wherein, the retaining device and each of the shuttles move to a first photographing position where the first camera photographs the single image including the electronic component and the hand mark, so as to allow the first camera to photograph the single image including the electronic component and the hand mark at the first photographing position.

4. The component transferring apparatus according to claim 1, wherein the socket mark has a circular shape and the hand mark has an annular shape larger than the socket mark, so as to locate the socket mark in the annular hand mark at the mounting position.

5. The component transferring apparatus according to claim 1, further comprising at least one other socket mark and the hand mark is provided so as to correspond to each of the socket marks.

6. The component transferring apparatus according to claim 1, wherein the socket mark has a rectangular shape and the hand mark has a rectangular frame-like shape larger than the socket mark, so as to locate the socket mark in the frame-like hand mark at the mounting position.

7. The component transferring apparatus according to claim 1, wherein the first relative-position calculating unit obtains the first relative position from an average of first relative position values already obtained by a predetermined number of times of calculations, and the second relative-position calculating unit obtains the second relative position from an average of second relative position values already obtained by a predetermined number of times of calculations.

8. The component transferring apparatus according to claim 1, wherein when the second camera photographs the single image including the socket mark and the hand mark, the retaining device allows a distance between the hand mark and the second camera to be equal to a distance between the socket mark and the second camera.

9. The component transferring apparatus according to claim 8, wherein the hand mark is shorter than the socket mark, and the retaining device moves to the mounting position before moving to a position where the distance between the hand mark and the second camera is equal to the distance between the socket mark and the second camera.

10. The component transferring apparatus according to claim 1, wherein the third relative-position calculating unit obtains the third relative position every time the electronic component is mounted in the inspection socket; the first relative-position calculating unit obtains the first relative position every predetermined number of times of calculations for the third relative position; and the second relative-position calculating unit obtains the second relative position every predetermined number of times of calculations for the third relative position.

11. The component transferring apparatus according to claim 1, wherein the third relative-position calculating unit obtains the third relative position every time the electronic component is mounted in the inspection socket; the second relative-position calculating unit obtains the second relative position every time the electronic component is mounted in the inspection socket; and the first relative-position calculating unit calculates the first relative position every predetermined number of times of calculations for the third relative position.

12. The component transferring apparatus according to claim 1, wherein the third relative-position calculating unit obtains the third relative position every time the electronic component is mounted in the inspection socket; the first relative-position calculating unit obtains the first relative position every predetermined number of times of calculations for the third relative position; and the second relative-position calculating unit obtains the second relative position when the electronic component has been transferred to the mounting position.

13. An IC handler comprising the component transferring apparatus according to claim 1.

14. The component transferring apparatus according to claim 10, further comprising a first mirror that is provided on the retaining device so as to reflect the socket mark and the hand mark located at the mounting position in a direction of the second camera and a second mirror that reflects the socket mark and the inspection socket in the direction of the second camera at a reflecting position above the inspection socket, wherein the second camera is located at a position where the single image including the socket mark and the inspection socket cannot be directly photographed and also located at a position where the single image including the socket mark and the hand mark located at the mounting position cannot be directly photographed, as well as the second camera photographs the single image including the socket mark and the hand mark via the first mirror located at the mounting position and also photographs the single image including the socket mark and the inspection socket via the second mirror located at the reflecting position.

15. The component transferring apparatus according to claim 10, wherein the retaining device and each of the shuttles move to a first photographing position where the first camera photographs the single image including the electronic component and the hand mark, so as to allow the first camera to photograph the single image including the electronic component and the hand mark at the first photographing position.

16. The component transferring apparatus according to claim 10, wherein the socket mark has a circular shape and the hand mark has an annular shape larger than the socket mark, so as to locate the socket mark in the annular hand mark at the mounting position.

17. The component transferring apparatus according to claim 10, further comprising at least one other socket mark and the hand mark is provided so as to correspond to each of the socket marks.

18. The component transferring apparatus according to claim 10, wherein the socket mark has a rectangular shape and the hand mark has a rectangular frame-like shape larger than the socket mark, so as to locate the socket mark in the frame-like hand mark at the mounting position.

19. The component transferring apparatus according to claim 10, wherein the first relative-position calculating unit obtains the first relative position from an average of first relative position values already obtained, and the second relative-position calculating unit obtains the second relative position from an average of second relative position values already obtained.

20. The component transferring apparatus according to claim 10, wherein when the second camera photographs the single image including the socket mark and the hand mark, the retaining device allows a distance between the hand mark and the second camera to be equal to a distance between the socket mark and the second camera.

21. The component transferring apparatus according to claim 20, wherein the hand mark is shorter than the socket mark, and the retaining device moves to the mounting position before moving to a position where the distance between the hand mark and the second camera is equal to the distance between the socket mark and the second camera.

* * * * *